(12) United States Patent
Huang et al.

(10) Patent No.: US 7,148,689 B2
(45) Date of Patent: Dec. 12, 2006

(54) PERMANENT MAGNET ASSEMBLY WITH MOVABLE PERMANENT BODY FOR MAIN MAGNETIC FIELD ADJUSTABLE

(75) Inventors: Xianrui Huang, Clifton Park, NY (US); Evangelos Trifon Laskaris, Niskayuna, NY (US); Kathleen Melanie Amm, Clifton Park, NY (US); Bruce Campbell Amm, Clifton Park, NY (US); Michael Anthony Palmo, Jr., Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/672,720

(22) Filed: Sep. 29, 2003

(65) Prior Publication Data

US 2005/0068140 A1    Mar. 31, 2005

(51) Int. Cl.
*G01V 3/00* (2006.01)
(52) U.S. Cl. .................................. 324/319; 335/302
(58) Field of Classification Search ............. 324/319, 324/320, 318, 307, 309, 300; 335/296, 298, 335/302
See application file for complete search history.

(56) References Cited

U.S. PATENT DOCUMENTS

| | | |
|---|---|---|
| 3,899,762 A | 8/1975 | Studders |
| 4,023,130 A * | 5/1977 | Ridler et al. ................ 335/219 |
| 4,496,395 A | 1/1985 | Croat |
| 4,540,453 A | 9/1985 | Boredelon |
| 4,667,123 A | 5/1987 | Denk |
| 4,672,346 A | 6/1987 | Miyamoto |
| 4,679,022 A | 7/1987 | Miyamoto |
| 4,741,094 A | 5/1988 | Denk |
| 4,777,464 A | 10/1988 | Takabatashi |
| 4,818,966 A | 4/1989 | Miyamoto |
| 4,827,235 A | 5/1989 | Inomata |
| 4,931,760 A | 6/1990 | Yamaguchi |
| 4,953,555 A | 9/1990 | Leupold |
| 4,998,976 A | 3/1991 | Rapoport |
| 5,063,934 A | 11/1991 | Rapoport |
| 5,229,723 A | 7/1993 | Sakurai |
| 5,252,924 A | 10/1993 | Sakurai |
| 5,283,544 A | 2/1994 | Sakurai |
| 5,291,171 A | 3/1994 | Kobayashi |
| 5,317,297 A | 5/1994 | Kaufman |
| 5,320,103 A | 6/1994 | Rapoport |
| 5,332,971 A | 7/1994 | Aubert |
| 5,343,180 A | 8/1994 | Fukumoto |
| 5,383,978 A | 1/1995 | Yamamoto |
| 5,431,165 A * | 7/1995 | Sellers ........................ 600/422 |
| 5,462,054 A | 10/1995 | Rapoport |
| 5,623,241 A | 4/1997 | Minkoff |
| 5,631,616 A | 5/1997 | Ohta |
| 5,680,086 A | 10/1997 | Allis |
| 5,825,187 A | 10/1998 | Ohashi |

(Continued)

FOREIGN PATENT DOCUMENTS

EP    0541653    5/1994

(Continued)

OTHER PUBLICATIONS

Abstract of Japan 2002-536,842.

(Continued)

*Primary Examiner*—Louis M. Arana
(74) *Attorney, Agent, or Firm*—Fletcher Yoder

(57) ABSTRACT

A permanent magnet assembly comprising a fixed permanent magnet body and a movable permanent magnet body which is movable relative to the fixed permanent magnet body.

40 Claims, 18 Drawing Sheets

U.S. PATENT DOCUMENTS

| | | |
|---|---|---|
| 5,942,962 A | 8/1999 | Gery |
| 6,120,620 A | 9/2000 | Benz |
| 6,130,538 A | 10/2000 | Carrozzi |
| 6,147,578 A | 11/2000 | Panfil |
| 6,150,911 A | 11/2000 | Katznelson |
| 6,157,281 A | 12/2000 | Katznelson |
| 6,163,240 A | 12/2000 | Zuk |
| 6,191,584 B1 | 2/2001 | Trequattrini |
| 6,198,286 B1 | 3/2001 | Trequattrini |
| 6,255,670 B1 | 7/2001 | Srivastava |
| 6,259,252 B1 | 7/2001 | Laskaris |
| 6,275,128 B1 | 8/2001 | Aoki |
| 6,281,775 B1 | 8/2001 | Rapoport |
| 6,311,383 B1 | 11/2001 | Umeda |
| 6,333,630 B1 | 12/2001 | Holsinger |
| 6,429,761 B1 | 8/2002 | Laskaris |
| 6,448,772 B1 | 9/2002 | Aoki |
| 6,452,472 B1 | 9/2002 | Aoki |
| 6,467,157 B1 | 10/2002 | Livni |
| 6,489,872 B1 | 12/2002 | Fukushima |
| 6,489,873 B1 | 12/2002 | Kruip |
| 6,518,754 B1 | 2/2003 | Edwards |
| 6,518,867 B1 | 2/2003 | Laskaris |
| 6,525,634 B1 | 2/2003 | Laskaris |
| 6,670,877 B1 * | 12/2003 | Rapoport .................... 335/296 |
| 2002/0021129 A1 | 2/2002 | Laskaris |
| 2002/0050895 A1 | 5/2002 | Zuk |
| 2003/0011451 A1 | 1/2003 | Katznelson |

FOREIGN PATENT DOCUMENTS

| | | |
|---|---|---|
| EP | 623939 | 11/1994 |
| EP | 0371775 | 3/1996 |
| EP | 526513 | 7/1996 |
| EP | 0541872 | 1/2000 |
| JP | 02141501 | 5/1990 |
| JP | 03170643 | 7/1991 |
| JP | 10174681 | 6/1998 |
| WO | 0048208 | 8/2000 |

OTHER PUBLICATIONS

"Electrical Engineering Concepts and Applications," A. Bruce Carlson et al., Addison-Wesley Publishing Co., 1990, pp. 119-121.

"Magnetic Materials and Their Properties," E.A. Brandes et al., Smithells Metal Reference Book, Butterworth-Heinemann Ltd., 1992, p. 20-6.

"Permanent Magnet Assembly and Method of Making Thereof," Laskaris et al., U.S. Appl. No. 10/309,146, filed Dec. 4, 2002.

"Permanent Magnet Assembly and Method of Making Thereof," Laskaris et al., U.S. Appl. No. 10/309,139, filed Dec. 4, 2002.

"Multiple Ring Polefaceless Permanent Magnetic and Method of Making," K.M. Amm et al.

* cited by examiner

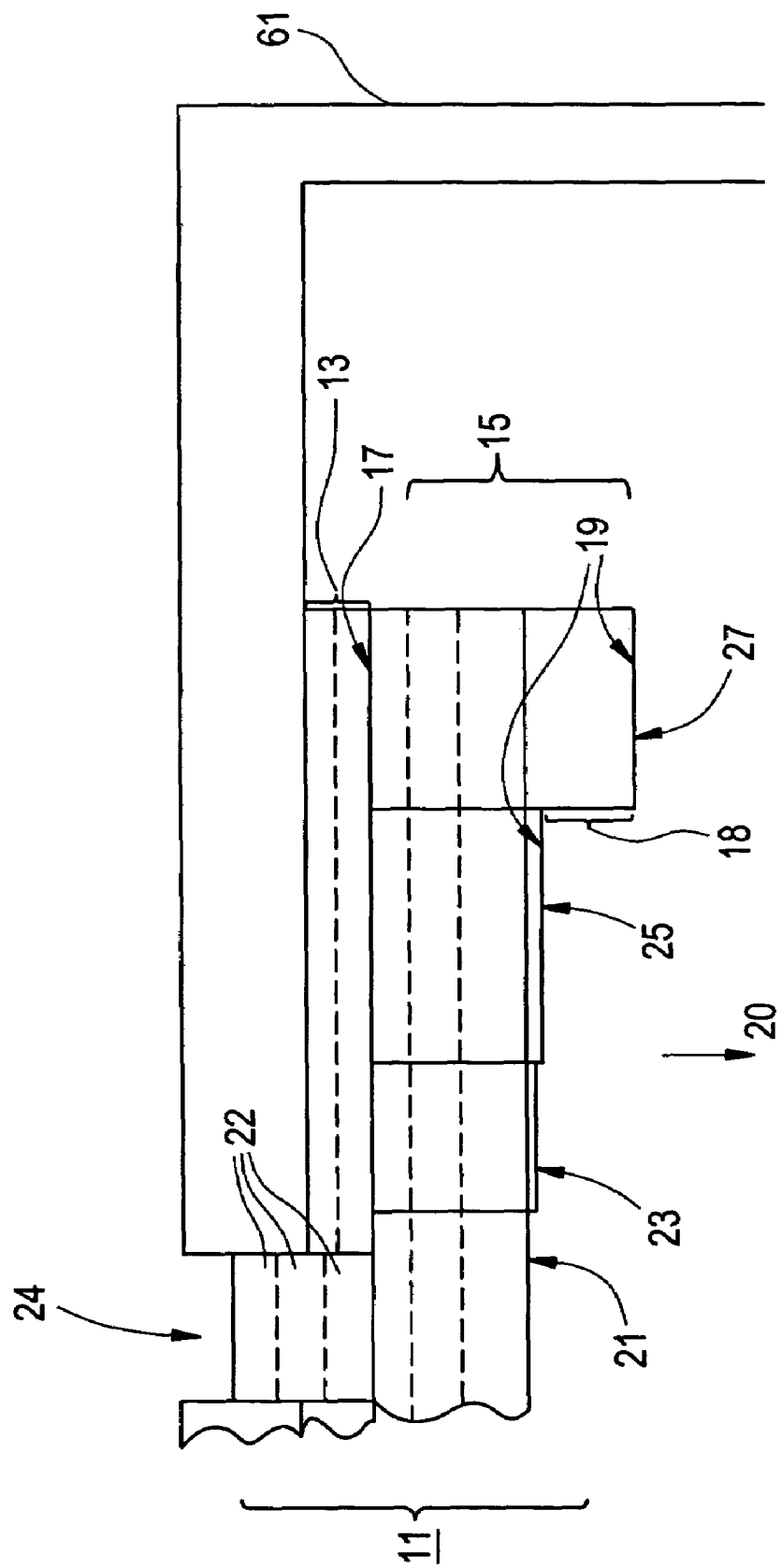

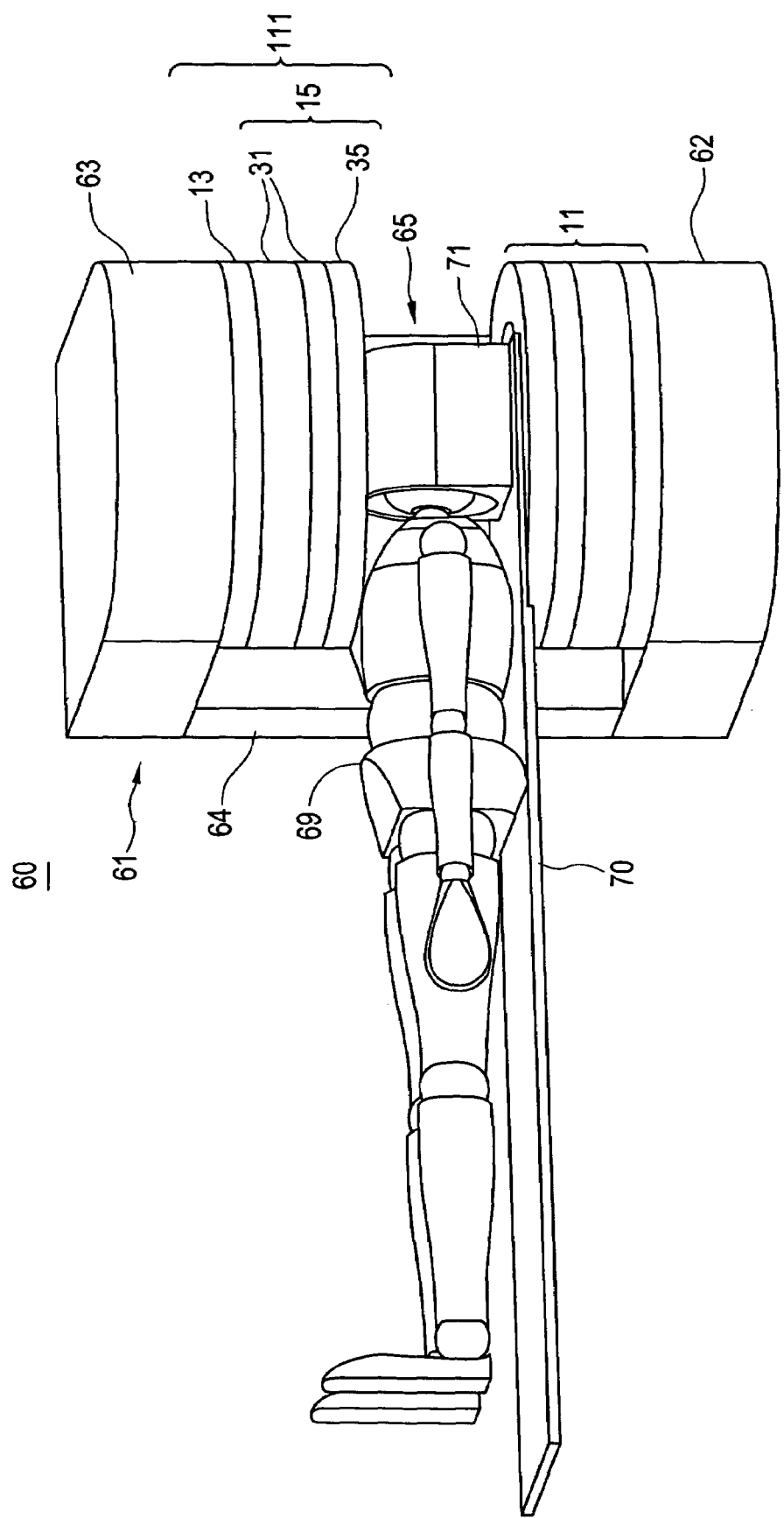

PERMANENT MAGNET ASSEMBLY WITH MOVABLE PERMANENT BODY FOR MAIN MAGNETIC FIELD ADJUSTABLE

BACKGROUND OF THE INVENTION

The present invention is directed generally to permanent magnet assemblies and more particularly to permanent magnet assemblies for MRI systems.

There are various magnetic imaging systems which utilize permanent magnets. These systems include magnetic resonance imaging (MRI), magnetic resonance therapy (MRT) and nuclear magnetic resonance (NMR) systems. MRI systems are used to image a portion of a patient's body. MRT systems are generally smaller and are used to monitor the placement of a surgical instrument inside the patient's body. NMR systems are used to detect a signal from a material being imaged to determine the composition of the material. These systems often utilize two or more permanent magnets directly attached to a support, frequently called a yoke. An imaging volume is provided between the magnets. A person or material is placed into the imaging volume and an image or signal is detected and then processed by a processor, such as a computer.

An MRI magnet should maintain a preset main magnetic field ($B_0$) with a narrow variation because a center frequency of the system is linear to the $B_0$ field and the RF and amplifiers/receivers are tuned to this frequency. The narrow bandwidth of the RF chain defines the allowable variation in the main magnetic field. In a superconducting or resistive MRI magnet, the correct $B_0$ field is achieved by adjusting the current in the magnet coils. In a permanent magnet, the $B_0$ field is determined by the magnetic motive force and the reluctance of the magnet. However, there are often differences between the actual $B_0$ field of a permanent magnet ("PM") and its designed value due to material property variations and the manufacturing tolerances of the magnet dimensions.

Several methods have proposed and used to adjust the $B_0$ field for permanent MRI magnets. One method includes the use of iron plugs to increase or decrease the air gap in the magnet flux circuit, which in turn decreases or increases the $B_0$ field due to changes in the magnet reluctance. Another method includes changing the operating temperature of the magnet, which changes the magnetization of the permanent magnet poles and thus changes the $B_0$ field. Yet another method includes using resistive coils to adjust the $B_0$ field. However, these methods are often complex to implement and sometimes do not achieve the desired $B_0$ field.

BRIEF SUMMARY OF THE INVENTION

A preferred embodiment of the present invention provides a permanent magnet assembly comprising a fixed permanent magnet body and a movable permanent magnet body which is movable relative to the fixed permanent magnet body.

Another preferred embodiment of the present invention provides a magnetic imaging apparatus, comprising a yoke comprising a first portion, a second portion and at least one third portion connecting the first and the second portions such that an imaging volume is formed between the first and the second portions, and a permanent magnet assembly attached to the first yoke portion, wherein the permanent magnet assembly comprises a fixed permanent magnet body and a movable permanent magnet body which is movable relative to the fixed permanent magnet body.

Another preferred embodiment of the present invention provides a method of making a permanent magnet assembly, comprising providing a fixed permanent magnet body, providing a movable permanent magnet body, and moving the movable permanent magnet body relative to the fixed permanent magnet body to adjust a $B_0$ field of the assembly.

BRIEF DESCRIPTION OF THE DRAWINGS

FIG. 8 is a perspective view of an MRI system containing a "C" shaped yoke.

DETAILED DESCRIPTION OF THE INVENTION

Figure 1:
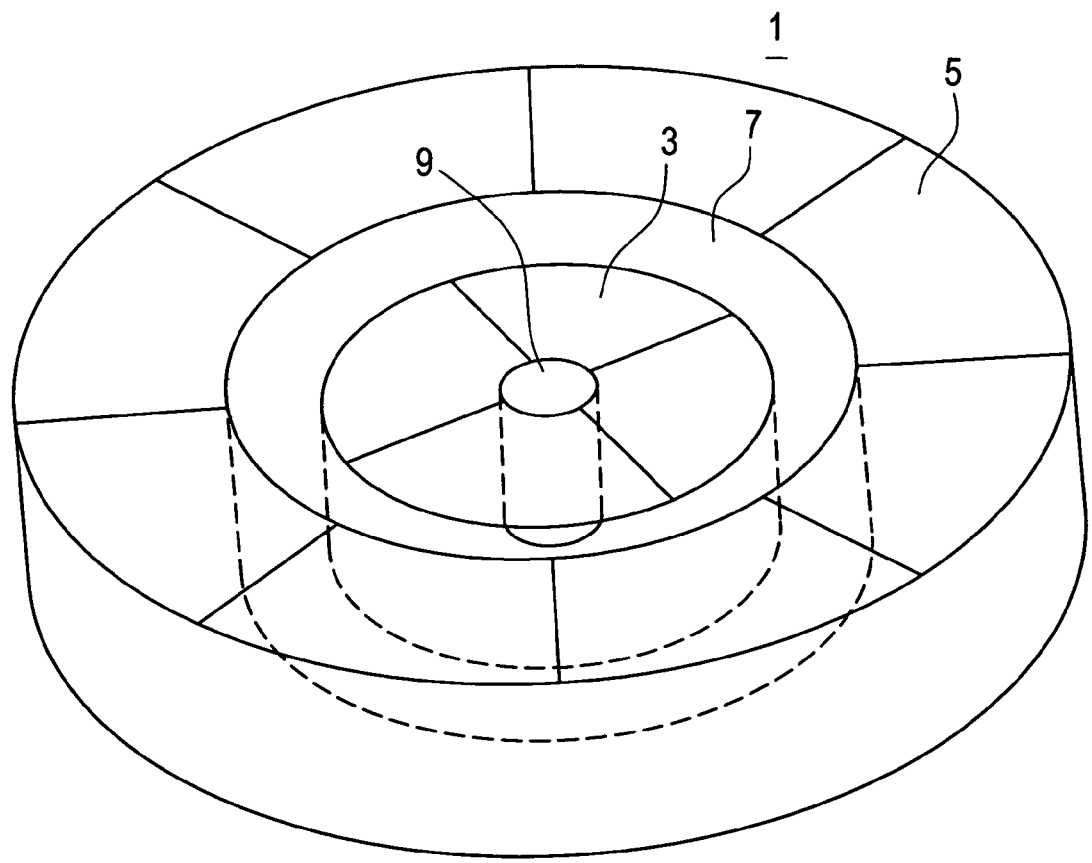
FIGS. 1 and 2 are side cross sectional views of right halves of permanent magnet assemblies according to the preferred embodiments of the present invention.

The present inventors have realized that a relatively small movable permanent magnet ("PM") body may be used to adjust the magneticmotive force and the $B_0$ field of a relatively large fixed permanent magnet body. Preferably, the movable PM body is movable with respect to the fixed PM body during the $B_0$ field adjustment process and does not move relative to the fixed PM body while the PM assembly is in operation. Preferably, the movable PM body is placed on the back side of the fixed PM body (i.e., the side of the fixed PM body that is opposite from the front or imaging side of the fixed PM body that faces the imaging volume of an imaging system). This placement allows mechanical fixtures or devices for installation, adjustment and/or movement of the movable PM body. Thus, the use of the movable PM body provides a simple, reliable, and cost effective method to adjust the $B_0$ field within the limits of variation experienced in PM magnet assemblies.

The term fixed PM body includes any PM body which is fixed to a stationary or movable system support. Preferably, the system comprises an imaging system, such as an MRI, MRT or NMR system. Most preferably, the system comprises an MRI system, the support comprises an MRI yoke and at least two MRI PM assemblies are attached to the yoke, where an imaging volume is formed between the assemblies. Each assembly contains the fixed and movable PM bodies. In the MRI system, the fixed PM body is a stationary PM body because it is fixed (i.e., non-movably attached) to a stationary yoke. However, the system may comprise a non-imaging system, such as a motor or a generator. Thus, the fixed PM body may be fixed to a movable support, such as a rotor.

Any suitable movable PM body which is movable with respect to the fixed PM body during the $B_0$ field adjustment process may be used. In an imaging system, the movable PM body is preferably located between the imaging system support and the fixed PM body. For example, movable PM body may comprise removable PM pieces and/or a movable PM plug located on the back, non-imaging side of the fixed PM body in a PM assembly. Preferably, during the operation of the PM assembly, the movable PM body is either fixed directly to the fixed PM body or the movable PM body is fixed to another part of the assembly. In either case, the movable PM body preferably does not move relative to the fixed PM body during the operation of the assembly, even if the assembly itself is located in a rotor and is moving during operation.

The PM pieces may comprise magnet bars, magnet discs or other shaped pieces which are manually or mechanically placed on the back side of the fixed PM body and which are removed from the imaging system to optimize the imaging system performance for a given set of conditions, such as to adjust the $B_0$ field of the PM assembly to maintain this field within the desired value ranges. Thus, a specific number of PM pieces of positive and/or negative magnetization may be placed or removed from the PM assembly to adjust the $B_0$ field of the PM assembly. If desired, pre-magnetized PM pieces with different PM masses may be used for fine field adjustment. The PM pieces are placed on the back side of the fixed PM body through an opening in the imaging system support, such as an MRI yoke. If desired, a backing material, such as steel laminations or other filler materials can be added to the PM pieces to keep the total volume of material on the back side of the fixed PM body constant.

In contrast to the PM pieces which are added to and removed from the system to adjust the $B_0$ field, the PM plug is not removed from the system. Instead, the PM plug position is adjusted relative to the fixed PM body to adjust the $B_0$ field. For example, the PM plug may be raised or lowered with respect to the back side of the fixed PM body to adjust the $B_0$ field. Thus, while the PM pieces provide a variable amount of PM material to the system for field adjustment, the PM plug provides a constant amount of PM material, but adjusts the field by its position. Of course a movable PM body which is a combination of the PM plug and PM pieces may also be used. This movable PM body adjusts the field by a variable amount of PM material which is located in a variable position within the system for fine field adjustment.

Thus, the addition or subtraction of PM pieces or relative movement of the PM plug adds or subtracts the magnetic-motive force (MMF) and adjusts the main magnetic field. The amount of PM material is determined by the measured $B_0$ field. Since PM pieces or PM plug can have positive or negative magnetization compared to that of the fixed PM body, this movable PM body adds or subtracts the total MMF of the magnet assembly and thus adjusts the $B_0$ field.

FIG. 1 illustrates a side cross sectional view of a right half of a magnet assembly 11 for an imaging apparatus according to a first preferred embodiment of the present invention. The left half of the assembly 11 is a mirror image of the right half and is not shown for clarity. The magnet assembly preferably contains at least one optional layer of soft magnetic material 13 and a fixed permanent magnet body 15 (also referred to as a pole of an imaging system), which contains a first surface 17 and a second surface 19. The first and the second surfaces are substantially parallel to the x-y plane, to which the direction of the magnetic field (i.e., the z-direction) is normal. The direction of the magnetic field (i.e., the z-axis direction) is schematically illustrated by the arrow 20 in FIG. 1. The first surface 17 is attached over the at least one layer of the soft magnetic material 13. The second or imaging surface 19 is adapted to face an imaging volume of the imaging apparatus. However, if desired, the at least one layer of the soft magnetic material 13 may be omitted.

In one preferred aspect of the present invention, a material of the fixed PM body 15 comprises any suitable magnetized permanent magnet material or alloy, such as CoSm, NdFe or RMB, where R comprises at least one rare earth element and M comprises at least one transition metal, for example Fe, Co, or Fe and Co. Preferably, this material comprises the RMB material, where R comprises at least one rare earth element and M comprises at least one transition metal, such as at least 50 atomic percent iron. Most preferred, the material comprises a praseodymium (Pr) rich RMB alloy as disclosed in U.S. Pat. No. 6,120,620, incorporated herein by reference in its entirety. The praseodymium (Pr) rich RMB alloy comprises about 13 to about 19 atomic percent rare earth elements, where the rare earth content consists essentially of greater than 50 percent praseodymium, an effective amount of a light rare earth elements selected from the group consisting of cerium, lanthanum, yttrium and mixtures thereof, and balance neodymium; about 4 to about 20 atomic percent boron; and balance iron with or without impurities. As used herein, the phrase "praseodymium-rich" means that the rare earth content of the iron-boron-rare earth alloy contains greater than 50% praseodymium. In another preferred aspect of the invention, the percent praseodymium of the rare earth content is at least 70% and can be up to 100% depending on the effective amount of light rare earth elements present in the total rare earth content. An effective amount of a light rare earth elements is an amount present in the total rare earth content of the magnetized iron-boron-rare earth alloy that allows the magnetic properties to perform equal to or greater than 29 MGOe $(BH)_{max}$ and 6 kOe intrinsic coercivity (Hci). In addition to iron, M may comprise other elements, such as, but not limited to, titanium, nickel, bismuth, cobalt, vanadium, niobium, tantalum, chromium, molybdenum, tungsten, manganese, aluminum, germanium, tin, zirconium, hafnium, and mixtures thereof. Thus, the material most preferably comprises 13–19 atomic percent R, 4–20 atomic percent B and the balance M, where R comprises 50 atomic percent or greater Pr, 0.1–10 atomic percent of at least one of Ce, Y and La, and the balance Nd.

The at least one layer of a soft magnetic material 13 may comprise one or more layers of any soft magnetic material. A soft magnetic material is a material which exhibits macroscopic ferromagnetism only in the presence of an applied external magnetic field. Preferably, the assembly 11 contains a laminate of a plurality of layers of soft magnetic material 13, such as 2–40 layers, preferably 10–20 layers. The possibility of the presence of plural layers is indicated by the dashed lines in FIG. 1. The individual layers are preferably laminated in a direction substantially parallel to the direction of the magnetic field emitted by the permanent magnet(s) of the assembly (i.e., the thickness of the soft magnetic layers is parallel to the magnetic field direction). However, if desired, the layers may be laminated in any other direction, such as at any angle extending from parallel to perpendicular to the magnetic field direction. The soft magnetic material may comprise any one or more of Fe—Si, Fe—Co, Fe—Ni, Fe—Al, Fe—Al—Si, Fe—Co—V, Fe—Cr—Ni and amorphous Fe— or Co-base alloys.

The magnet assembly 11 may have any shape or configuration. For example, the assembly 11 may have a width or outside diameter of about 40 cm to about 90 cm (i.e., about 0.4 to about 0.9 meters). Preferably, the second surface 19 that is adapted to face an imaging volume of the imaging apparatus is shaped to optimize the shape, strength and uniformity of the magnetic field. The optimum shape of the fixed PM body 15 and its second surface 19 may be determined by a computer simulation, based on the size of the imaging volume, the strength of the magnetic field of the permanent magnet(s), shim design or shimmability and other design consideration. For example, the simulation may comprise a finite element analysis method. In a preferred aspect of the present invention, the second surface 19 has a circular cross section which contains a plurality of concentric rings 21, 23, 25, 27 that extend to different heights respective to one another, as shown in FIG. 1. In other words, the surface 19 is stepped, and contains at least four steps 21, 23, 25 and 27. Most preferably, the heights of the rings 21, 23, 25, 27 decrease from the outermost ring 27 to the inner most or central ring 21, as shown in FIG. 1. However, there may be two, three or more than four rings, and a height of any inner ring may be greater than a height of any outer ring, as shown in FIG. 2 and as described in more detail below, depending on the system configuration and the materials involved.

Preferably, the height 18 of ring 27 from step 25 to surface 19 is at least 0.05 meters, such as between 0.05 and 0.075 meters, preferably about 0.0625 meters, to form a pocket that is filled with shims. The height of rings 23 and 25 shown in FIG. 1 is preferably less than 0.03 meters, such as 0.1 to 20 millimeters. In other words, the imaging surface of each of the rings 21, 23, 25 extends less than 0.03 meters from an imaging surface of an adjacent, inner ring. Thus, in a preferred aspect of the present invention, the outer ring 27 has a height of at least 0.05 meters, while each inner ring 23, 25 of the assembly has a height that the less than 0.03 meters. Preferably, at least two of the inner rings 21, 23 are machined into one section of the fixed PM body 15, while the outer ring 27 comprises another section of the permanent magnet body which is made separately and attached to the first section containing the inner rings.

Figure 2B:
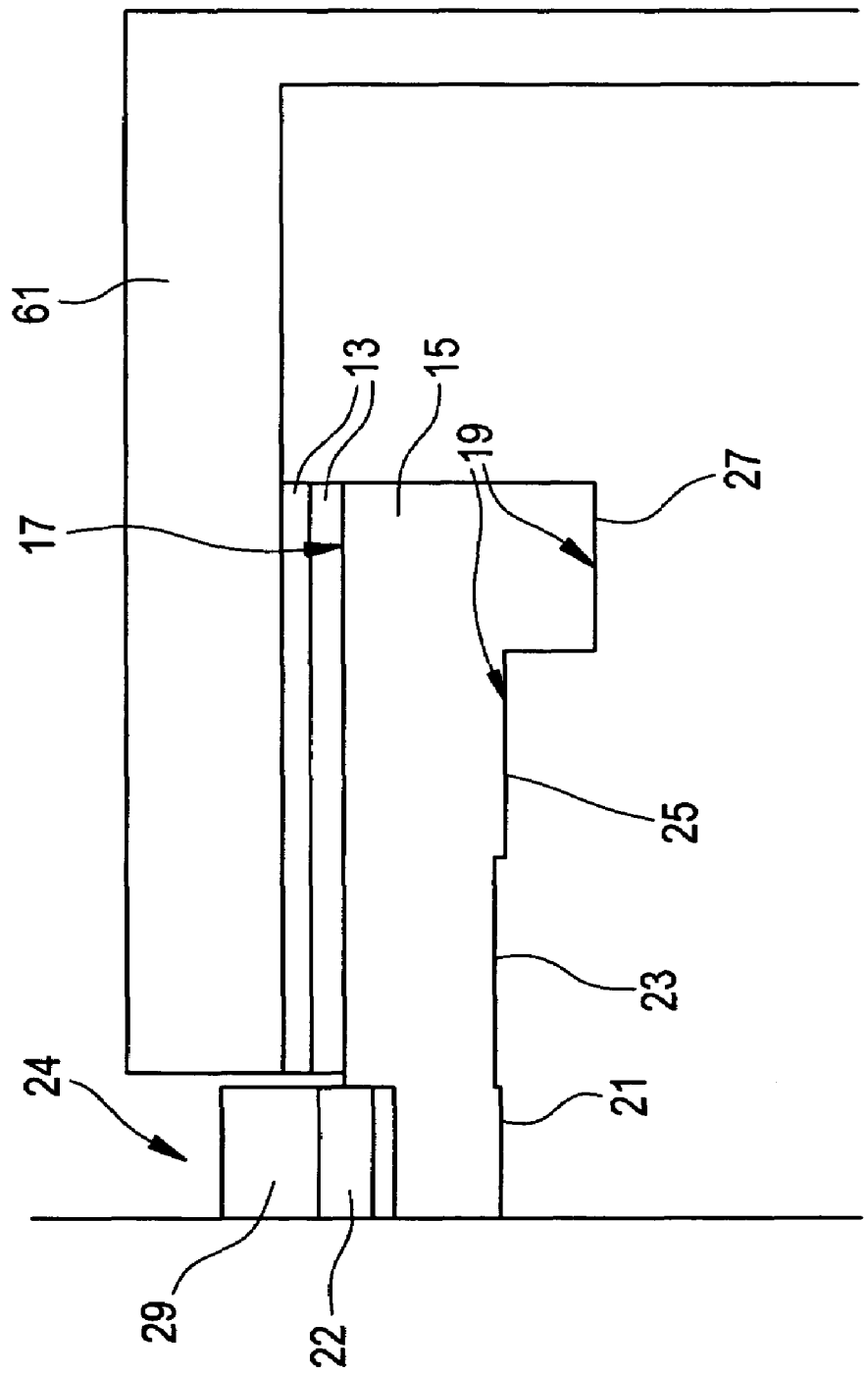

In another preferred aspect of the first embodiment illustrated in FIG. 2, the height of the first central (i.e., the inner most) solid ring 21 is greater than a height of an adjacent hollow ring 23 surrounding the first central solid ring 21. The central ring 21 forms a protrusion in the imaging surface 19 of the assembly. Thus, the first inner hollow ring 23 located next to the central ring 21 has the smallest height of all the rings in the assembly 11. Preferably, the central ring 21 has a height that is less than the height of the third hollow ring 25 which surrounds the second ring 23 and less than the higher of the outer hollow ring 27. Preferably, the height 18 of ring 27 from step 25 to surface 19 is at least 0.05 meters, such as between 0.05 and 0.075 meters, preferably about 0.0625 meters, to form a pocket that is filled with shims. The height of rings 21 and 25 shown in FIG. 2 is preferably less than 0.03 meters, such as 0.1 to 20 millimeters.

As discussed above, the assembly 11 contains any suitable movable PM body which is movable with respect to the fixed PM body 15 during the $B_0$ field adjustment process. The movable body may be located between the imaging system support 61 and the fixed PM body 15. For example, movable permanent magnet body may comprise the removable permanent magnet pieces 22 located in an opening 24 extending through the at least one layer of soft magnetic material 13 and support 61, as illustrated in FIGS. 1 and 2. Alternatively, the movable permanent magnet body may comprise the movable permanent magnet plug 26 located in an opening 24, as illustrated in FIG. 3.

As described above, the permanent magnet pieces 22 may comprise permanent magnet bars, discs or other shaped pieces which are manually or mechanically placed on the back side 17 of the fixed PM body 15 through the opening 24 in the at least one layer of soft magnetic material 13, as shown in FIGS. 1 and 2. Thus, a specific number of pieces 22 of positive and/or negative magnetization may be placed or removed from the assembly 11 to optimize the imaging system performance for a given set of conditions, such as to adjust the $B_0$ field of the assembly 11 to maintain this field within the desired value ranges. The pieces 22 are located in the opening 24 in the imaging apparatus support or yoke 61 and on the back surface 17 of the fixed PM body 15. If desired, a metal backing or filler, such as stainless steel laminates or an iron backing, may be inserted or removed from between the yoke 61 and the permanent magnet pieces 22. The backing may be used to keep the metal volume of the assembly constant irrespective of the number of PM pieces 22 added to or removed from the assembly 11. Thus, the amount of backing material may be inversely proportional to the amount or volume of PM pieces. The PM pieces 22 may be secured to the fixed PM body 15 after the desired $B_0$ field is obtained. However, the secured PM pieces are considered "a movable PM body" because they are movable with respect to the fixed PM body during the $B_0$ field adjustment process.

Figure 3:
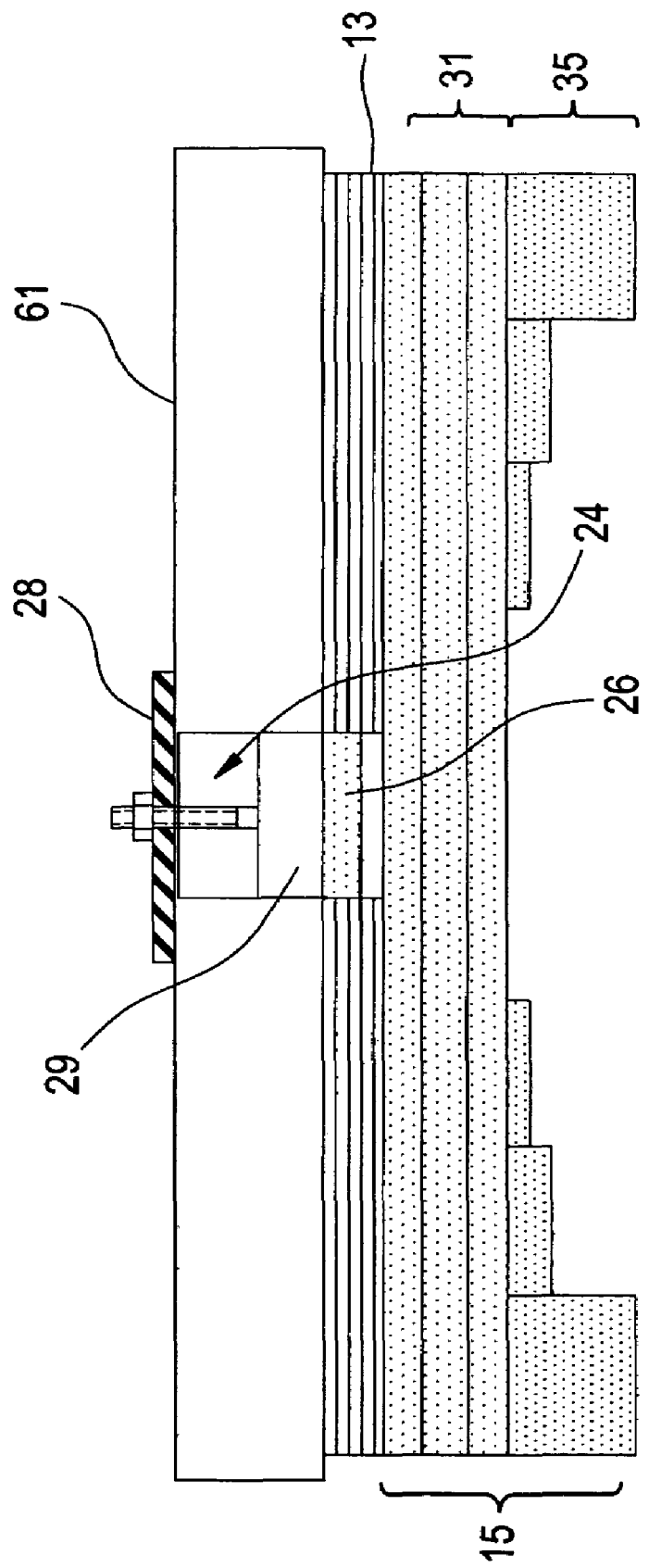
FIG. 3 is a perspective view of a permanent magnet assembly having a permanent magnet plug.

Alternatively, a movable permanent magnet plug 26 is located in the opening 24, as shown in FIG. 3. The permanent magnet plug 26 may be moved up and down in the opening 24 (i.e., along the axis of the opening) relative to the fixed PM body 15 by any suitable actuator 28 which is adapted to move the movable permanent magnet plug. For example, the actuator 28 may be any suitable mechanical or electromechanical device, such a threaded rod, a pulley or a rail, which is manually or mechanically actuated to move the plug 26. Preferably, the actuator 28 is a threaded rod which lifts and lowers the plug 26 when the rod is rotated about its axis. A gear box may also be used to improve the ease of movement of the plug 26. A metal backing 29, such as an iron backing may be inserted between the actuator 28 and the plug 26. If desired, the plug 26 may be removed from the assembly 11 under certain conditions, if desired. The PM plug 26 may be secured by the actuator 28 in a preferred position relative to the fixed PM body 15 after the desired $B_0$ field is obtained. However, the secured PM plug 26 is considered "a movable PM body" because it is movable with respect to the fixed PM body 15 during the $B_0$ field adjustment process.

The movable permanent magnet body 22, 26 may comprise the same or different permanent magnet material as the fixed PM body 15. The movable PM body may have a positive or negative magnetization compared to the magnetization of the fixed PM body 15. The movable PM body is moved with respect to the fixed PM body 15 to adjust the $B_0$ field of the magnet assembly to maintain this field within the desired value ranges.

If desired, the opening 24 for the movable permanent magnet body 22, 26 may extend from the back side 17 into the fixed PM body 15, as shown in FIG. 2. Thus, the movable magnet body 22, 26 may be moved in and out of the opening 24 to fill and empty out, respectively, the end portion of the opening 24 located in the fixed PM body 15. Preferably, the opening 24 extends only part of the way through the fixed PM body 15. The opening 24 may have any suitable diameter, such as 5 to 30 cm, for example. The movable PM body may have any suitable dimensions that fit into the opening 24, such as a height and a width of 5 to 30 cm, such as 20 to 30 cm, for example. Other suitable sizes of the opening and the movable PM body may be used depending on the size of the system, the lifting power of the actuator 28 and the effect of the opening 24 on the flux path through the fixed PM body 15.

Preferably, the center axis of the opening 24 is aligned with the center of the fixed PM body 15. Thus, the movable PM body 22, 26 is adjusted (i.e., placed or moved) and centered on the middle of the fixed PM body 15. However, if desired, the movable body 22, 26 may be located off center with respect to the center of the fixed PM body 15. Furthermore, if desired, a plurality of openings 24 housing a plurality of PM bodies 22, 26 may be located in the system for fine field adjustment. These plural openings 24 may be symmetrically or asymmetrically arranged with respect to the center of the fixed PM body 15, as desired. Each of the plurality of openings 24 may contain a movable PM body 22 and/or 26 of the same or different magnetization and/or at the same or different position with respect to the fixed PM body and/or of the same or different size as the other movable PM bodies.

In another preferred embodiment of the present invention, the fixed PM body 15 comprises at least two sections. Preferably, these sections are laminated in a direction perpendicular to the direction of the magnetic field (i.e., the thickness of the sections is parallel to the magnetic field direction). Most preferably, each section is made of a plurality of square, hexagonal, trapezoidal, annular sector or other shaped blocks adhered together by an adhesive substance. An annular sector is a trapezoid that has a concave top or short side and a convex bottom or long side.

Figure 4:
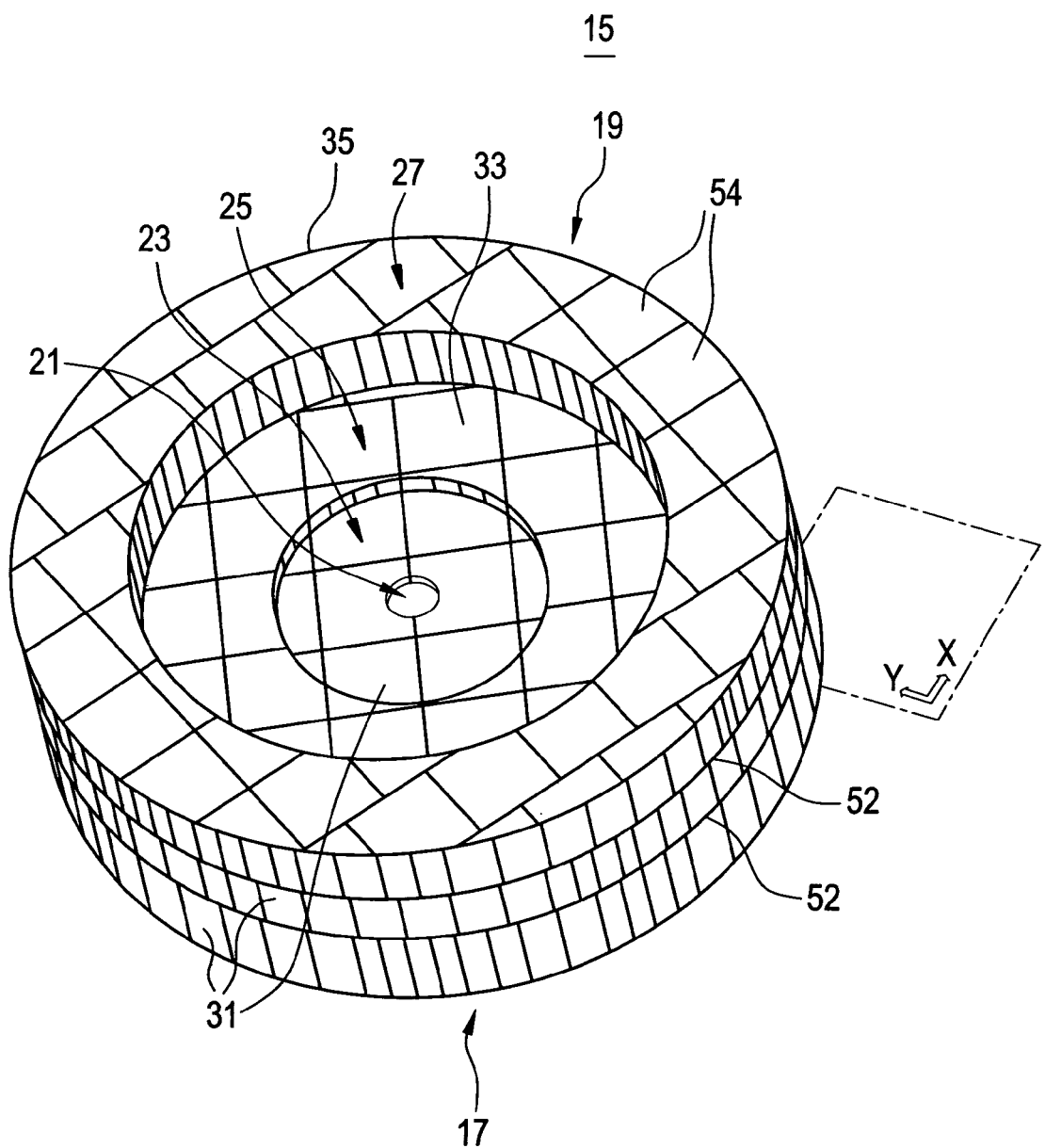
FIG. 4 is a perspective view of a permanent magnet body according to a preferred embodiment of the present invention.
Figure 5:
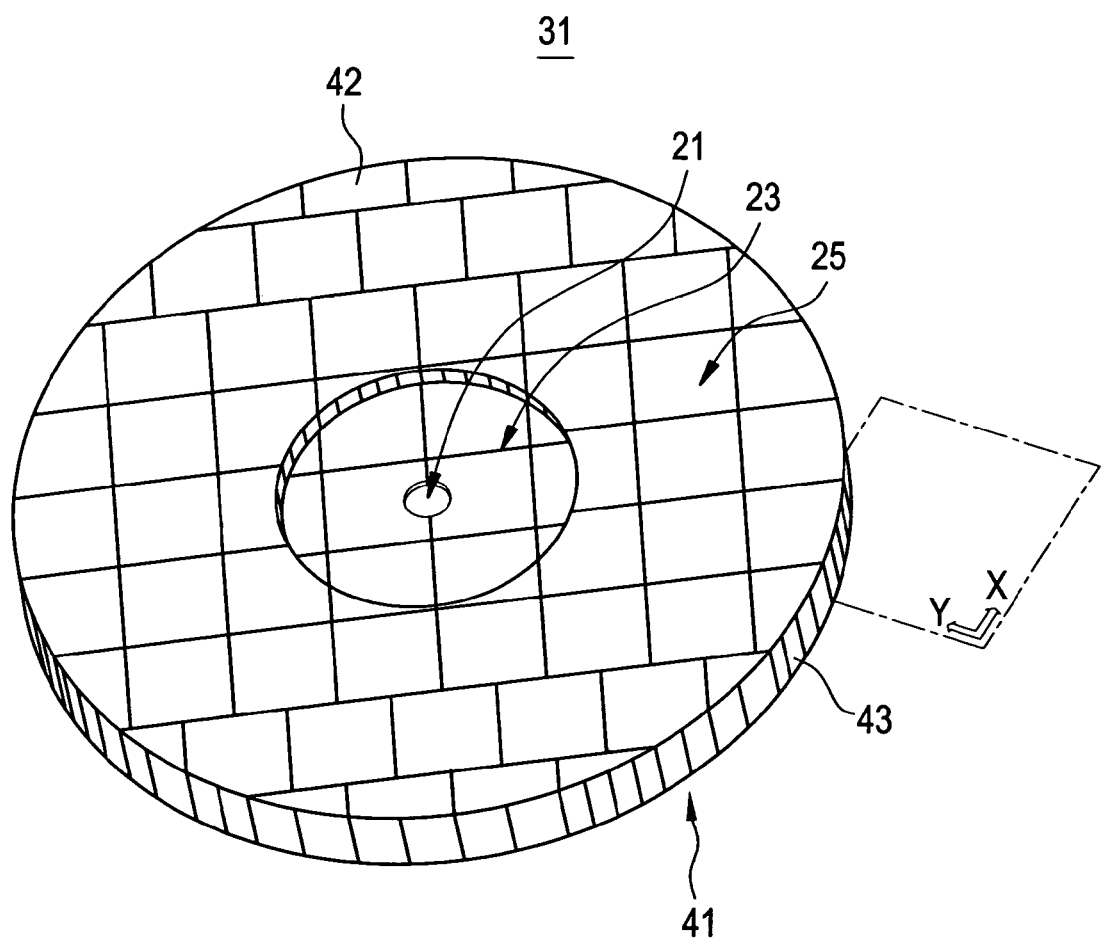
FIG. 5 is a perspective view of a base section of the body of FIG. 4.
Figure 6:
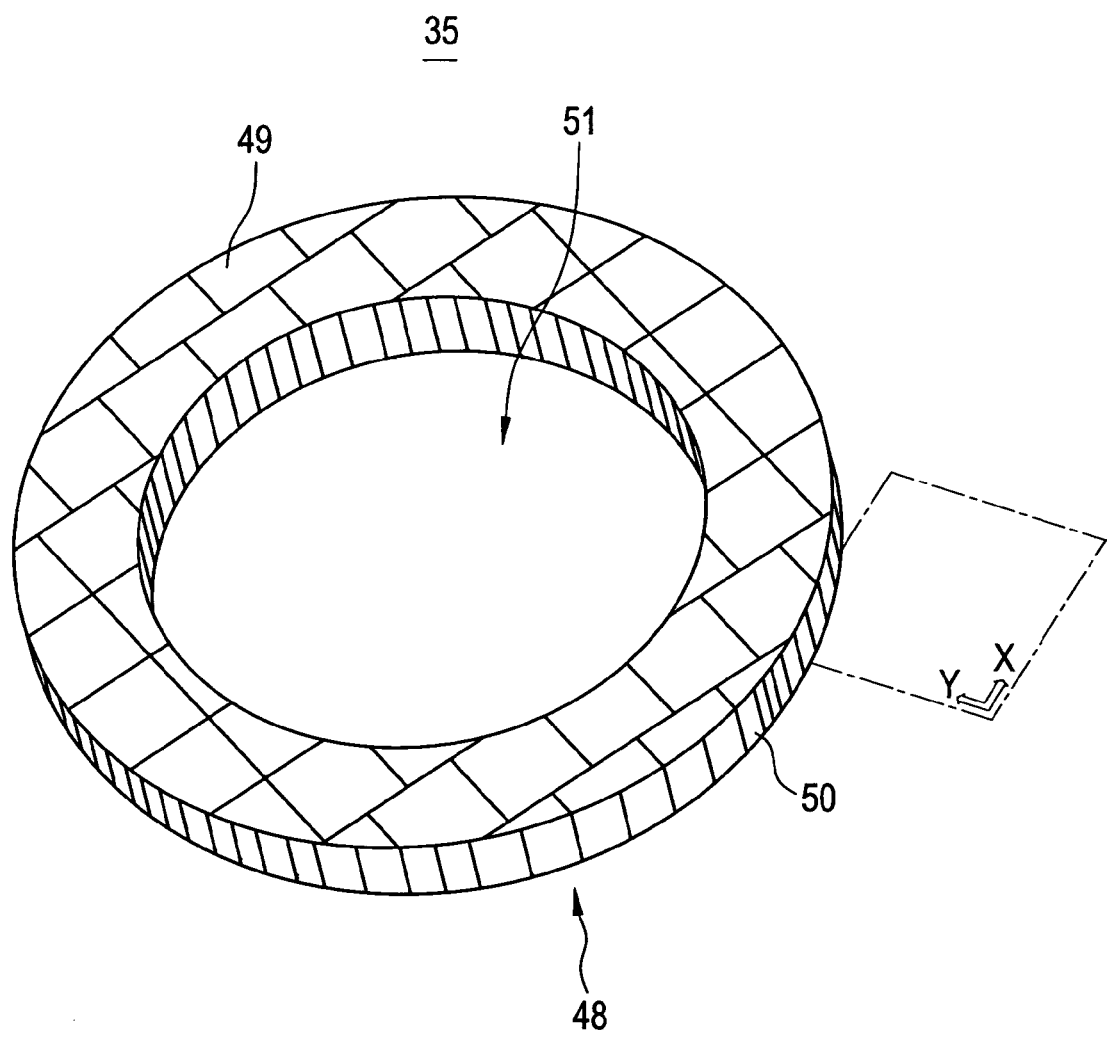
FIG. 6 is a perspective view of a hollow ring section of the body of FIG. 4.

One preferred configuration of the body 15 is shown in FIG. 4. The body 15 comprises a permanent magnet base section or body 31, as shown in FIG. 5, and a permanent magnet hollow ring section or body 35, as shown in FIG. 6. A pocket 33 filled with shims is formed by the steps in the imaging surface 19 of the body 15.

The base section 31 preferably has a cylindrical configuration, as shown in FIG. 5. The first 41 and second 42 major surfaces of the base section 31 are the "bottom" and "top" surfaces of the cylinder (i.e., the bases of the cylinder). The major surfaces 41, 42 have a larger diameter than the height of the edge surface 43 of the cylinder 31. Preferably, but not necessarily, the first or back surface 41 is flat. The first surface 41 corresponds to the first surface 17 that is adapted to be attached to the at least one layer of soft magnetic material 13, as shown in FIGS. 1 and 2.

The second surface 42 is stepped, and preferably has at least three steps 21, 23 and 25. At least two of the steps, such as the inner steps 21 and 23, in the second surface 42 of the base section 31 are machined into the second surface 42. The outer step 25 may comprise the original surface of the base section 31, if desired. The inner portion of second surface 42, such as steps 21 and 23 and the inner portion of step 25, comprises the inner portion of the imaging surface 19 of the permanent magnet assembly 11. As described above, the inner steps 23, 25 preferably have a height that is less than 0.03 meters. If desired, the inner most or central step 21 may comprise a protrusion, as shown in FIG. 2, rather than a recess, as shown in FIGS. 4 and 5.

The hollow ring section 35 is attached to an outer portion of second surface 42 of the base section 31. The hollow ring section 35 also has a cylindrical configuration, with the first 48 and a second 49 major surfaces being base surfaces of the ring cylinder 35, as shown in FIG. 6. The major surfaces 48, 49 have a larger diameter than a height of the edge surface 50 of the ring section. The hollow ring section 35 has a circular opening 51 extending from the first 48 to the second 49 base surface, parallel to the direction of the magnetic field 20. The hollow ring section 35 is formed over the second major surface 42 of the base section 31, such that the steps or rings 21, 23 and 25 are exposed through the opening 51. The first major surface 48 of the section 35 is attached to the second surface 42 of the section 31, while the second major surface 49 of the section 35 comprises an outer portion of the imaging surface 19 of the permanent magnet assembly 11. Thus, the first and second surfaces of the base section and the first and second surfaces of the hollow ring section are arranged substantially perpendicular to a direction of a magnetic field of the magnet assembly.

Preferably, the second surface 49 of the ring section 35 extends at least 0.05 meters, such as between about 0.05 and about 0.075 meters above an outer step 25 on the second surface 42 of the base body 31. The width (i.e., the difference between the internal and external diameter) of the ring section 35 is preferably at least 0.05 meters, such as about 0.1 to about 0.5 meters, preferably about 0.25 to about 0.3 meters. In other words, the height and width of the ring section 35 is preferably at least 0.05 meters. The inner diameter of the ring section 35 forms a pocket 33. The pocket 33 is filled with metal shims. Preferably, the shims are made of non-permanent magnet material, such as iron and other suitable metals and alloys.

The sections 31 and 35 of the fixed PM body 15 may be attached to each other and to the soft magnetic material layer(s) 13 by any appropriate means, such as adhesive layers, brackets and/or bolt(s). Preferably, a layer 52 of adhesive substance, such as epoxy or glue is provided between the second surface 42 of the base section 31 and the first surface 48 of the hollow ring body 35.

Preferably, the cylindrical base body 31 and the hollow ring body 35 comprise a plurality of square, hexagonal, trapezoidal or annular sector shaped blocks 54 of permanent magnet material adhered together by an adhesive substance, such as epoxy. However, the bodies 31 and 35 may comprise unitary bodies instead of being made up of individual blocks. Preferably, the base section 31 comprises at least two layers of permanent magnet blocks 54. For example, the base section 31 may comprise three layers of permanent magnet blocks 54 as shown in FIG. 1.

The magnet assembly 11 of the preferred embodiments of the present invention is preferably used in an imaging system, such as an MRI, MRT or an NMR system. Most preferably, at least two magnet assemblies of the preferred embodiments are used in an MRI system. The magnet assemblies are attached to a yoke or a support in an MRI system.

Figure 7:
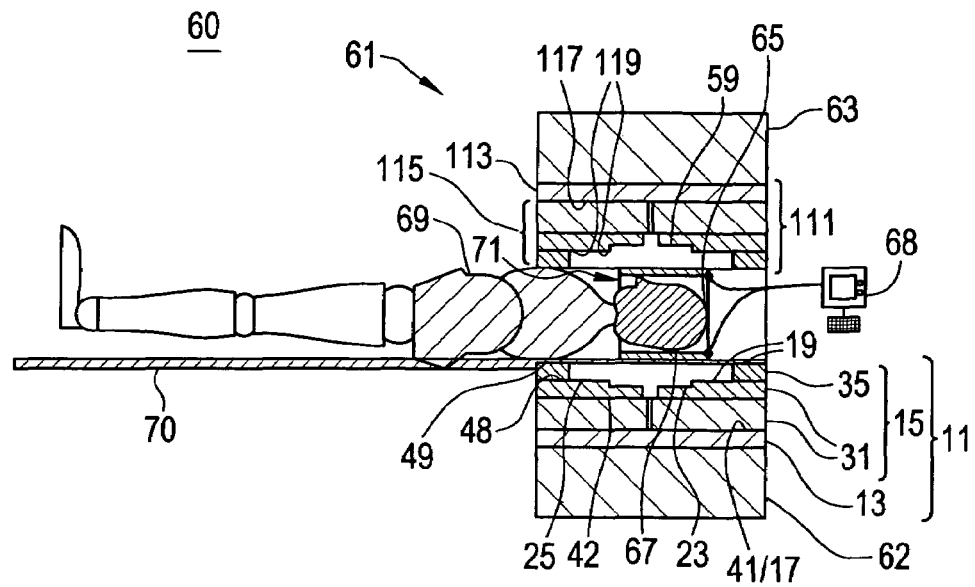
FIG. 7 is a side cross sectional view of an MRI system containing a permanent magnet assembly according to the preferred embodiments of the present invention.

Any appropriately shaped yoke may be used to support the magnet assemblies. For example, a yoke generally contains a first portion, a second portion and at least one third portion connecting the first and the second portion, such that an imaging volume is formed between the first and the second portion. FIG. 7 illustrates a side cross sectional view of an MRI system 60 according to one preferred aspect of the present invention. The system contains a yoke 61 having a bottom portion or plate 62 which supports the first magnet assembly 11 and a top portion or plate 63 which supports the second magnet assembly 111. It should be understood that "top" and "bottom" are relative terms, since the MRI system 60 may be turned on its side, such that the yoke contains left and right portions rather than top and bottom portions. The imaging volume is 65 is located between the magnet assemblies.

As described above, the first magnet assembly 11 comprises at least one fixed PM body 15 containing an imaging (i.e., second) surface 19 exposed to the imaging volume 65 and a movable PM body as well as at least one soft magnetic material layer 13 located between a back (i.e., first) surface 17 of the at least one fixed permanent magnet 15 and the first yoke portion 62. The second magnet assembly 111 is preferably identical to the first assembly 11. The second magnet assembly 111 comprises at least one fixed permanent magnet body 115 containing an imaging (i.e., second) surface 119 exposed to the imaging volume 65 and a movable PM body as well as at least one soft magnetic material layer 113 in between a back (i.e., first) surface 117 of the at least one permanent magnet 115 and the second yoke portion 63. The minimum height of imaging volume 65 between surfaces 19 and 119 is preferably about 0.2 to about 0.6 meters.

The MRI system 60 is preferably operated without pole pieces formed between the imaging surfaces 19, 119 of the fixed permanent magnet bodies 15, 115 of the first 11 and second 111 magnet assemblies and the imaging volume 65. However, if desired, very thin pole pieces may be added to further reduce or eliminate the occurrence of eddy currents. The MRI system further contains conventional electronic components, such as an optional gradient coil, an rf coil 67 and an image processor 68, such as a computer, which converts the data/signal from the rf coil 67 into an image and optionally stores, transmits and/or displays the image. If desired, the gradient coil may be omitted. These elements are schematically illustrated in FIG. 7.

FIG. 7 further illustrates various optional features of the MRI system 60. For example, the system 60 may optionally contain a bed or a patient support 70 which supports the patient 69 whose body is being imaged. The system 60 may also optionally contain a restraint 71 which rigidly holds a portion of the patient's body, such as a head, arm or leg, to prevent the patient 69 from moving the body part being imaged. The magnet assemblies 11, 111 may be are attached to the yoke 61 by bolts or by other means, such as by brackets and/or by glue.

The system 60 may have any desired dimensions. The dimensions of each portion of the system are selected based on the desired magnetic field strength, the type of materials used in constructing the yoke 61 and the assemblies 11, 111 and other design factors.

In one preferred aspect of the present invention, the MRI system 60 contains only one third portion 64 connecting the first 62 and the second 63 portions of the yoke 61. For example, the yoke 61 may have a "C" shaped configuration, as shown in FIG. 8. The "C" shaped yoke 61 has one straight or curved connecting bar or column 64 which connects the bottom 62 and top yoke 63 portions.

Figure 9:
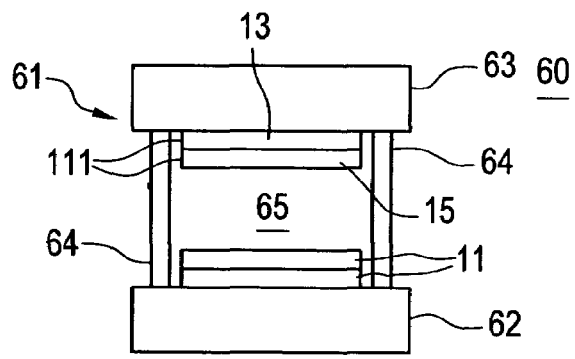
FIG. 9 is a side cross sectional view of an MRI system containing a yoke having a plurality of connecting bars.

In another preferred aspect of the present invention, the MRI system 60 has a different yoke 61 configuration, which contains a plurality of connecting bars or columns 64, as shown in FIG. 9. For example, two, three, four or more connecting bars or columns 64 may connect the yoke portions 62 and 63 which support the magnet assemblies 11, 111.

Figure 10:
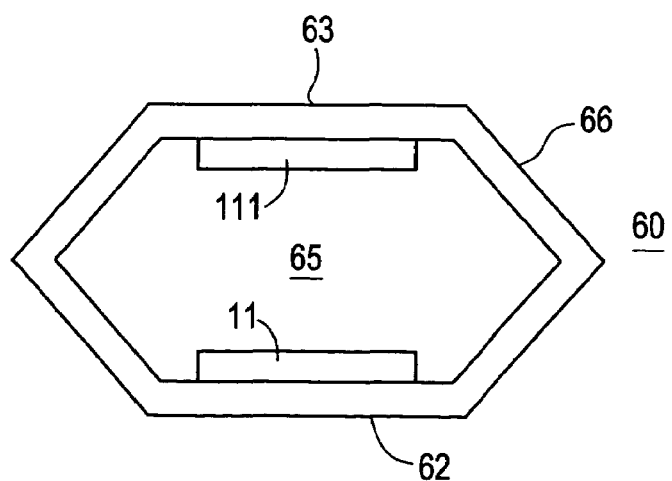
FIG. 10 is a side cross sectional view of an MRI system containing a tubular yoke.

In yet another preferred aspect of the present invention, the yoke 61 comprises a unitary tubular body 66 having a circular or polygonal cross section, such as a hexagonal cross section, as shown in FIG. 10. The first magnet assembly 11 is attached to a first portion 62 of the inner wall of the tubular body 66, while the second magnet assembly 111 is attached to the opposite portion 63 of the inner wall of the tubular body 66 of the yoke 61. If desired, there may be more than two magnet assemblies in attached to the yoke 61. The imaging volume 65 is located in the hollow central portion of the tubular body 66.

The imaging apparatus, such as the MRI 60 containing the permanent magnet assembly 11, is then used to image a portion of a patient's body using magnetic resonance imaging. Prior to imaging, the position of the movable PM body 22, 26 is adjusted with respect to the fixed PM body 15. For example, PM pieces 22 are either inserted or removed from the MRI system and/or the PM plug is moved up or down with respect to the back side of the fixed PM body. The PM pieces 22 may be inserted and removed through the opening 24 in the yoke. The PM plug 26 is moved up and down in the opening by actuator 28. If the opening 24 extends into the fixed PM body 15, the movable PM body 22, 26 may be located in the opening 24 within the fixed PM body.

A patient 69 enters the imaging volume 65 of the MRI system 60, as shown in FIGS. 7 and 8. A signal from a portion of a patient's 69 body located in the volume 65 is detected by the rf coil 67, and the detected signal is processed by using the processor 68, such as a computer. The processing includes converting the data/signal from the rf coil 67 into an image, and optionally storing, transmitting and/or displaying the image.

It should be noted that a system, such as an NMR system for imaging non-living materials may be used instead of an MRI system. Furthermore, the PM assembly containing the movable PM body and an the fixed PM body may be located in a system other than an imaging system, such as in a motor or in a generator.

Figure 11:
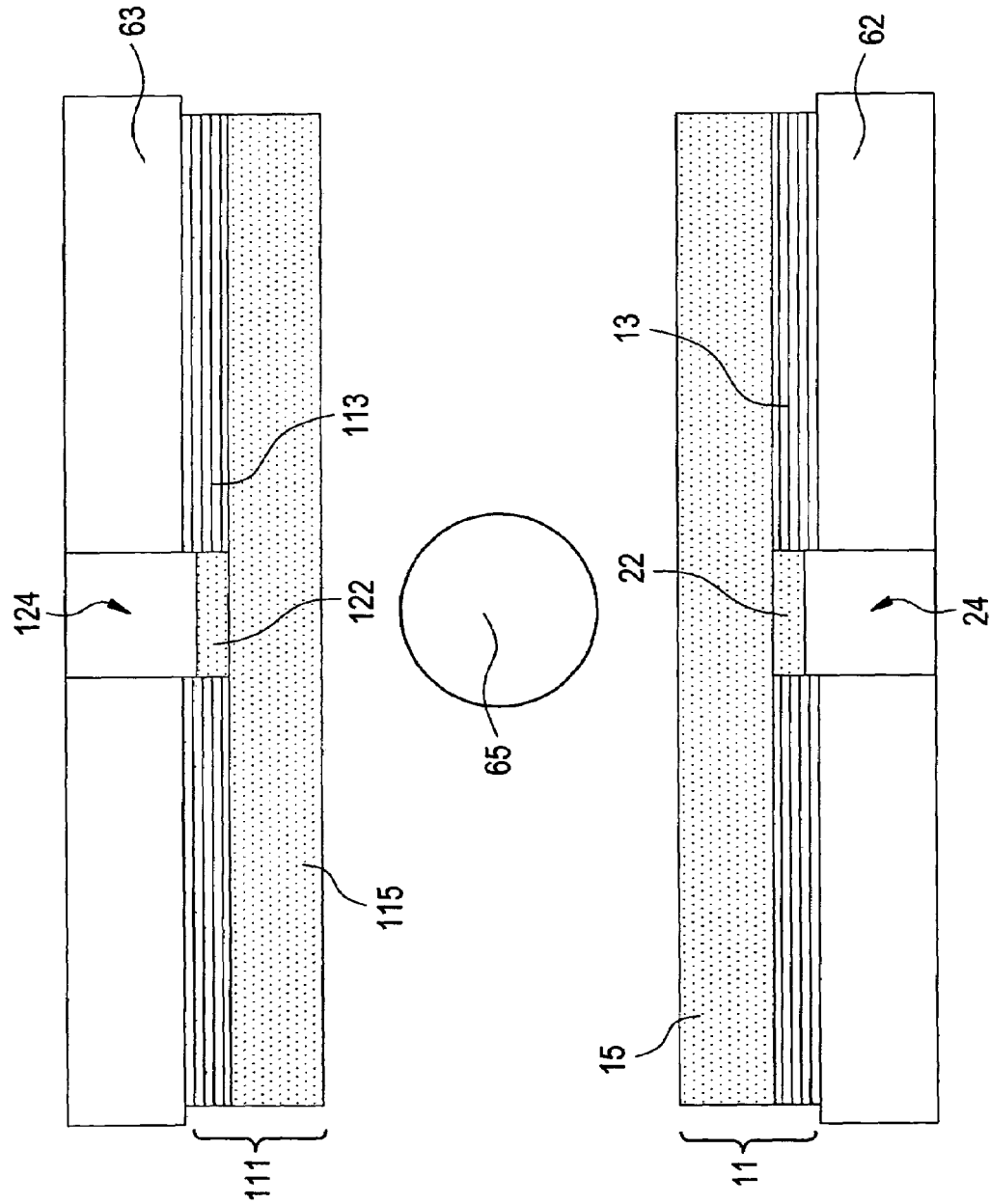
FIGS. 11 and 12 are side cross sectional views of imaging systems according to alternative preferred embodiments of the present invention.
Figure 12:
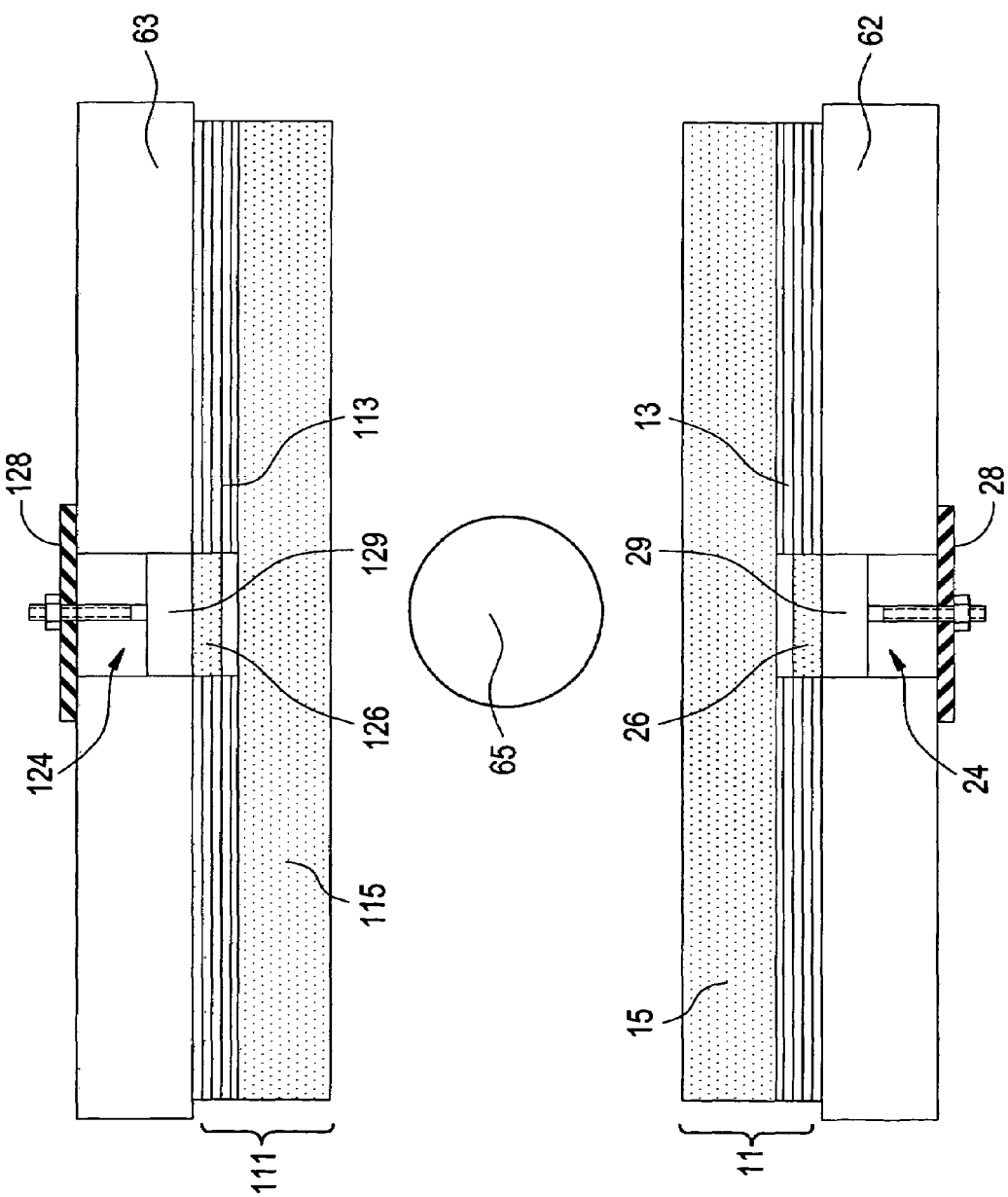

In alternative embodiments of the present invention, the fixed PM body 15 has a different configuration than that illustrated in FIGS. 1–6. For example, the imaging surface of the fixed PM body 15 may have a different number of steps and/or a different step configuration. Alternatively, as illustrated in FIGS. 11 and 12, the fixed PM body 15 may have a flat rather than a stepped imaging surface 19. Furthermore, as illustrated in FIGS. 11 and 12, plural magnet assemblies of the imaging system may have the movable PM body 22, 26. Preferably, each permanent magnet assembly 11, 111 contains the same movable PM body. However, if desired, each assembly 11, 111 may contain a different movable PM body or no PM body at all. For example, as illustrated in FIG. 11, both assemblies 11, 111 contain the same PM pieces 22, 122 located in the respective opening 24, 124 of each assembly. Likewise, as illustrated in FIG. 12, both assemblies 11, 111 contain the same PM plug 26, 126 located in the same position in each respective opening 24, 124 of each assembly. Each PM plug 26, 126 contains a respective actuator 28, 128 and backing piece 29, 129.

Figure 13:
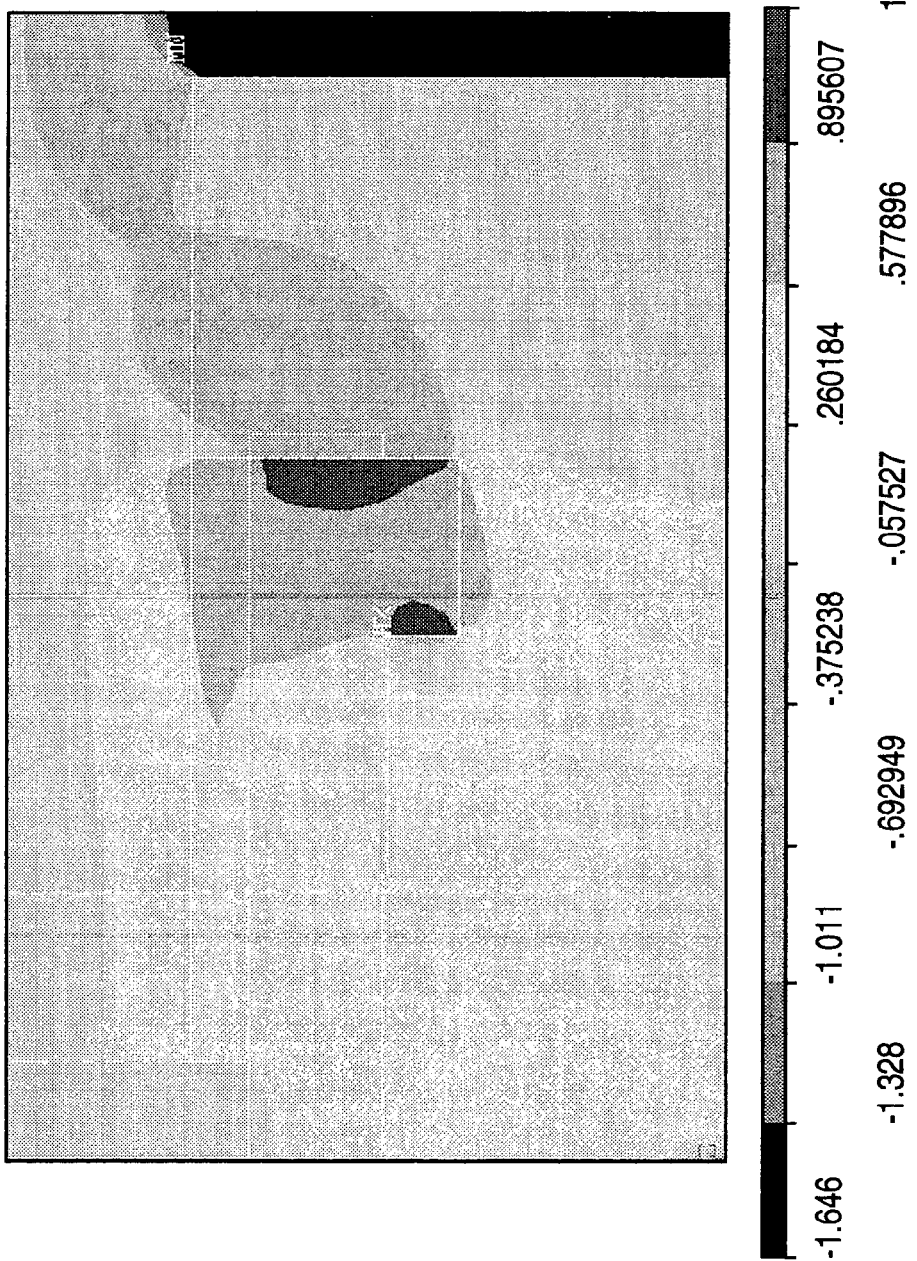
FIGS. 13, 14 and 15 are simulations of magnetic field distribution in an imaging system of FIG. 11 without PM pieces, with positive PM pieces and with negative PM pieces, respectively.
Figure 14:
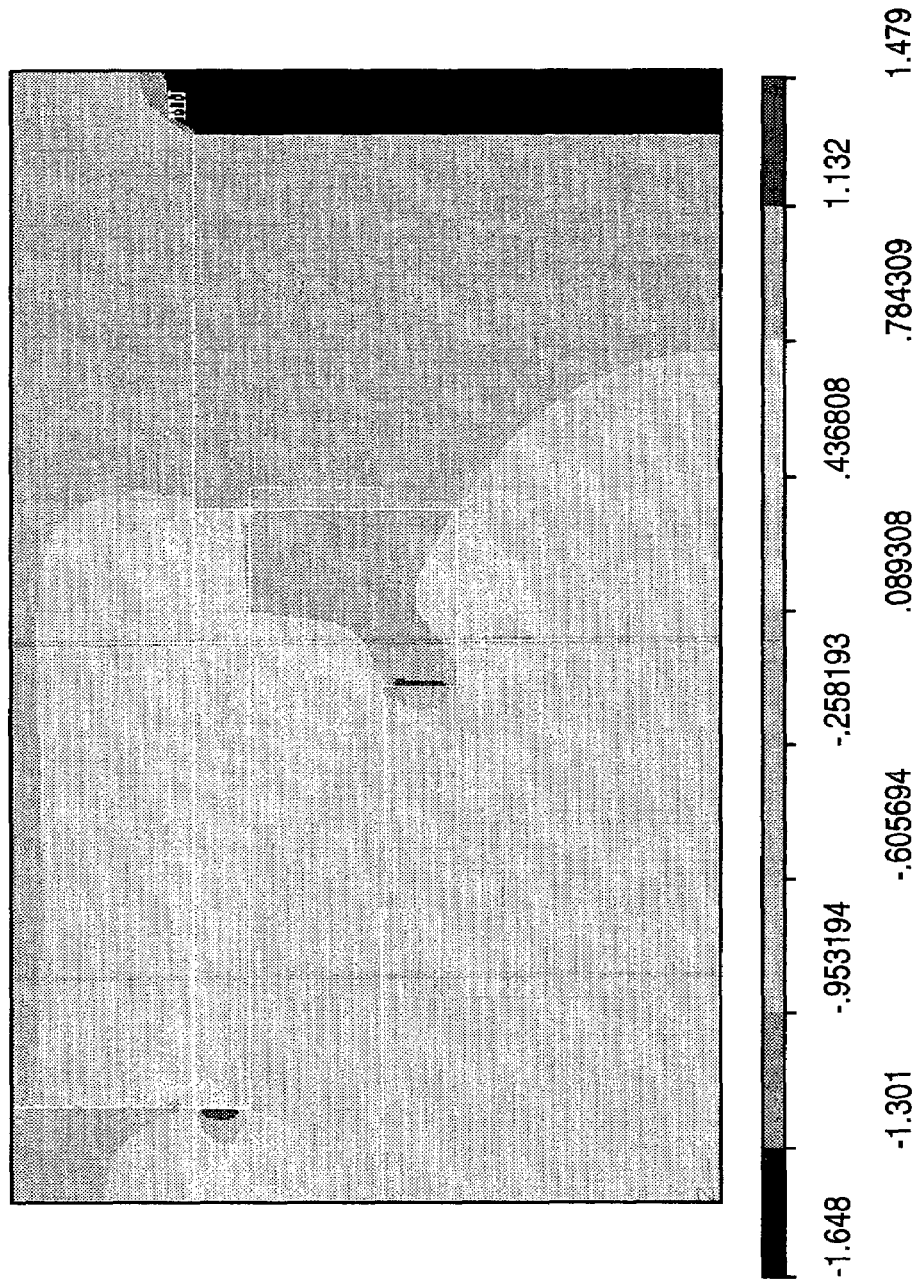
Figure 15:
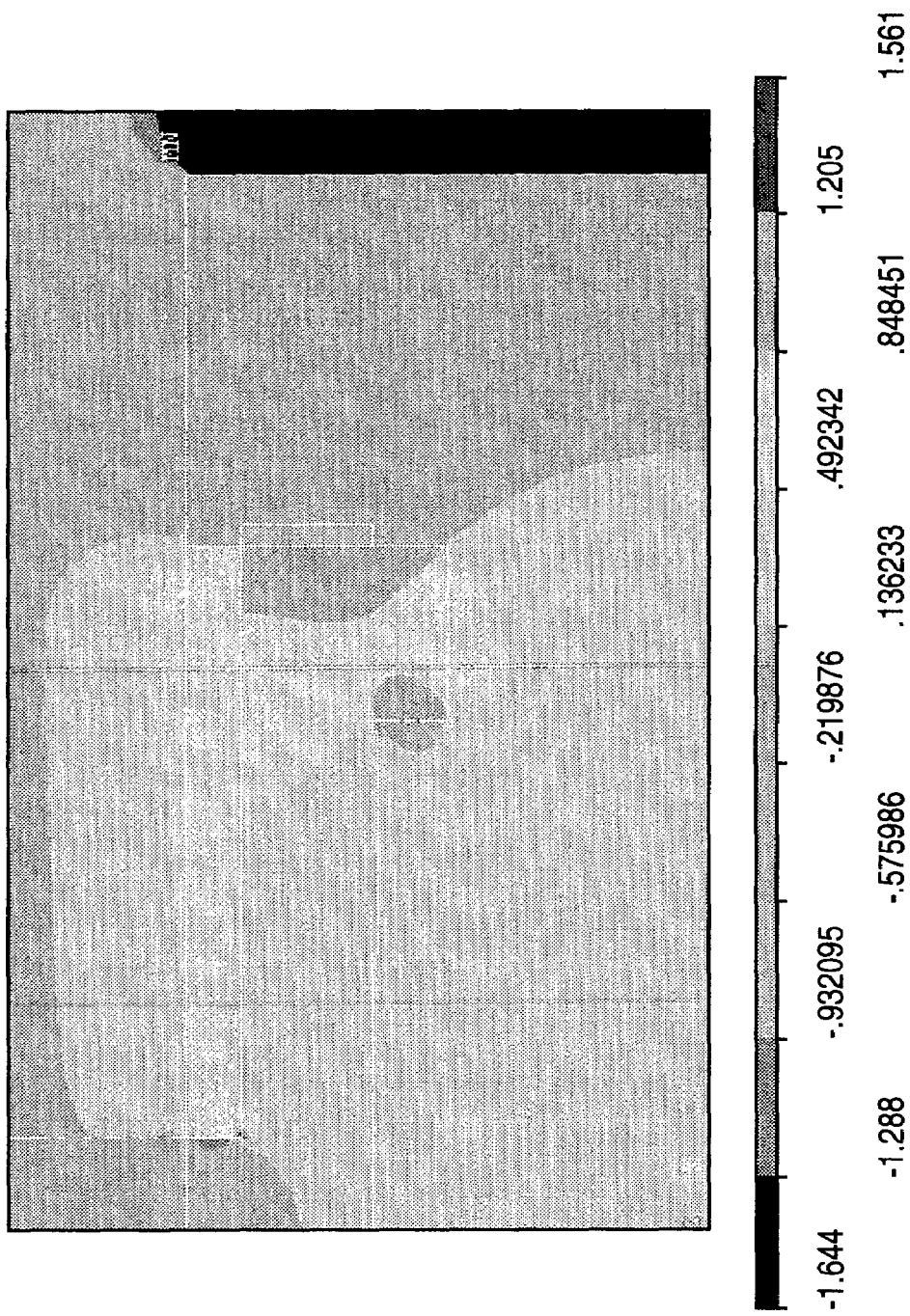

FIGS. 13, 14 and 15 compare the simulated magnetic field distribution between the magnet assembly 11 of FIG. 11 without the PM pieces 22 (FIG. 13), with positive PM pieces 22 (FIG. 14) or with negative PM pieces 22 (FIG. 15). For example, as shown in these Figures, placing nine 5×5×5 cm$^3$ PM block shaped pieces 22 on the poles (i.e., the fixed PM body magnet) 15 can increase or decrease the $B_0$ field by about 35 Gauss, depending on the polarity of the PM pieces.

Figure 16:
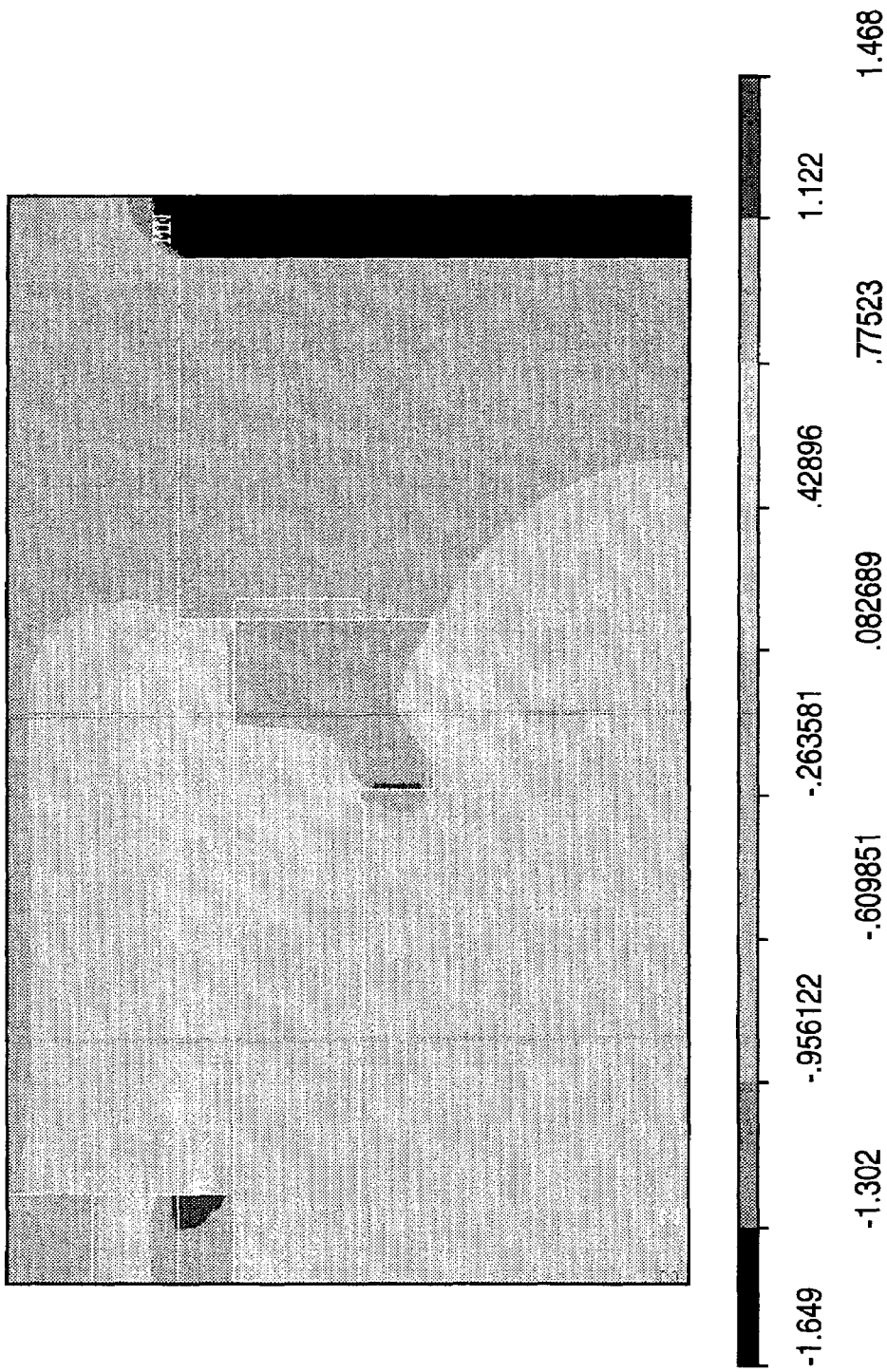
FIGS. 16 and 17 are simulations of magnetic field distribution in an imaging system of FIG. 12 based on a position of a PM plug.
Figure 17:
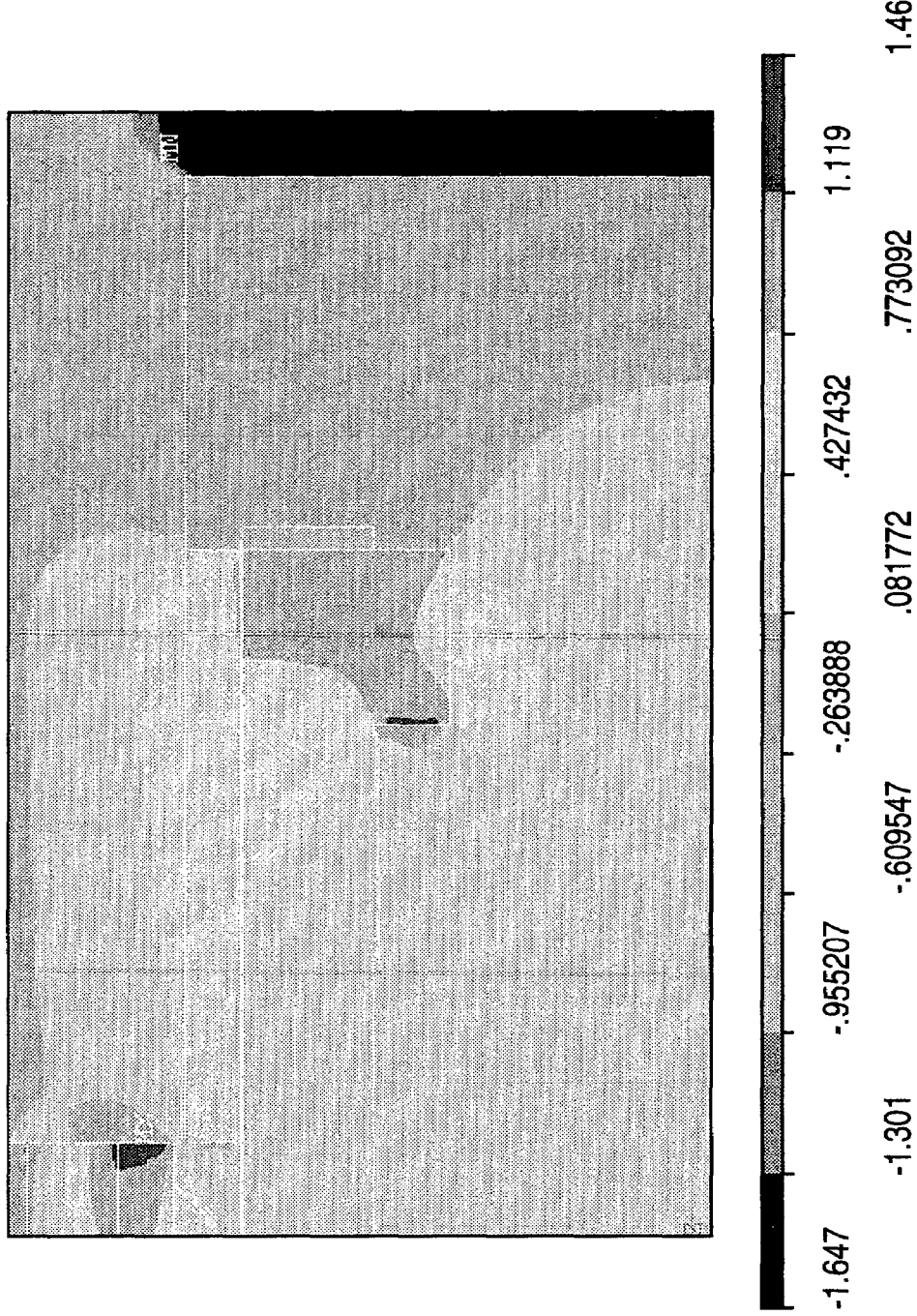

As shown in FIG. 12, the PM plug 26 with fixed amount of PM material and an iron backing piece 29 is placed at the center of the fixed PM body 15 of the assembly 11. The plug 26 is moved up and down by the actuator 28 to adjust the gap between the PM plug 26 and the fixed PM body 15 (i.e., the pole) to adjust the $B_0$ field. FIGS. 16 and 17 illustrate how the field changes with different plug-pole gaps in the system of FIG. 12. The gap is zero cm in FIG. 16 and six cm in FIG. 17.

Figure 18:
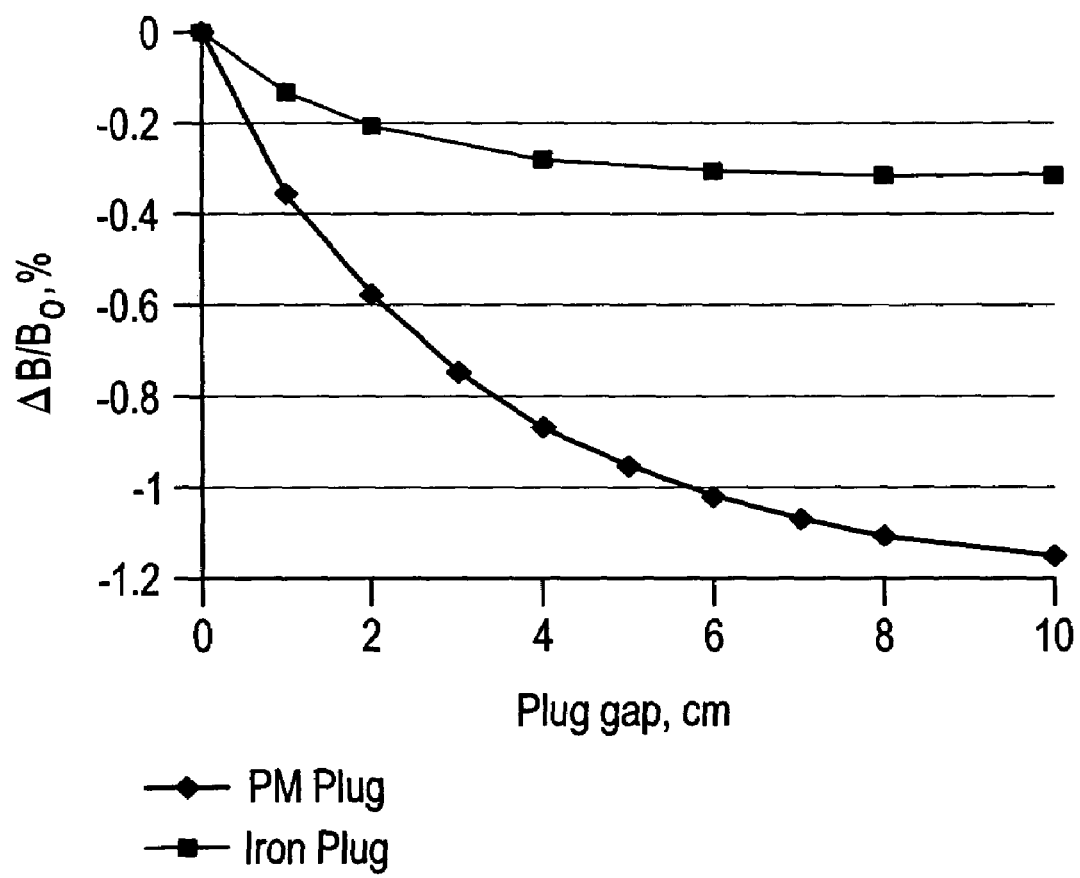
FIG. 18 is a plot comparing $B_0$ field adjustability with an iron plug and with a PM plug.

The PM plug 26 is much more effective in $B_0$ field adjustment than an iron plug. FIG. 18 compares the calculated $B_0$ field adjustability ($\Delta B/B_0$) of a PM assembly using either a PM plug or an iron plug, plotted as a function of the gap between the pole and the plug. As shown in FIG. 18, a $15 \times 15$ cm$^2$ PM plug 26 can provide at least about a 1.15% $B_0$ field adjustability for a gap of up to 10 cm, which is about four times greater than that which can be obtained with an iron plug of a same size.

The $B_0$ field adjustments by using the PM pieces 22 or the PM plug 26 may be performed in conjunction with the initial phase of the magnet shimming process. The movable PM body 22, 26 primarily changes the $B_0$ field, but may also impact the magnet homogeneity. Shimming is used to reduce magnet inhomogeniety, but it can also make a small adjustment of the magnet $B_0$ field. Thus, the $B_0$ field adjustment using the movable PM body and the coarse shimming process are preferably combined. In other words, the $B_0$ field adjustment using the movable PM body is performed taking into account the effect of coarse shimming on the $B_0$ field, while the coarse shimming is performed taking into account the effect of the movable PM body on homogeneity. At the end of this process, the desired $B_0$ field range is achieved and most of the inhomogeniety is removed. If desired, fine shimming may then be continued without adding, removing or adjusting the movable PM body.

Thus, as described above, a relatively small amount of PM materials can have sufficient changes in MMF and $B_0$ field adjustment. Placement of the movable PM body on the back instead of the front side of the fixed PM body is preferred because it allows backside mechanical fixtures to be used for installation and/or spacing adjustment of the movable PM body which do interfere with the system operation. This method used to adjust the $B_0$ field within the limits of variation experienced in permanent MRI magnets is simple, reliable, and cost effective.

A method of making the permanent magnet assembly 11 and the MRI system 60 will now be described with respect to another preferred embodiment of the present invention. A precursor body comprising a first unmagnetized material is attached to the support or yoke of the imaging apparatus prior to magnetizing the first unmagnetized material to form a first permanent magnet body. For example, the precursor body may be the fixed body 15 made up of sections 31 and 35 described above and the unmagnetized movable body 22 or 26.

It is preferred to form the permanent magnet body or bodies described above by magnetizing the unmagnetized precursor body or bodies prior to attaching this body (or bodies) to the imaging apparatus support. However, the permanent magnet body or bodies may be magnetized before being attached to the support or yoke, if desired.

A method of making an imaging device, such as an MRI, MRT or NMR system, includes providing a support, attaching a first precursor body or bodies comprising a first unmagnetized material to the first support portion and magnetizing the first unmagnetized material to form a first permanent magnet body or bodies after attaching the first precursor body. Preferably, a second precursor body or bodies comprising the same or different unmagnetized material as the first material is attached to the second support portion and magnetized to form a second permanent magnet body after attaching the second precursor body or bodies.

The support preferably contains first portion, a second portion and at least one third portion connecting the first and the second portion such that an imaging volume is formed between the first and the second portions. For example, the support may comprise the yoke 61 of FIGS. 7, 8, 9 or 10 of the MRI system 60. The first and second precursor bodies may comprise any unmagnetized material that is suitable for use as a permanent magnet such as the fixed PM body, and optionally the movable PM body as well. Preferably the precursor bodies comprise an assembly of plurality of blocks of an RMB alloy, where R comprises at least one rare earth element and M comprises at least one transition metal, as described above.

If desired, at least one layer of soft magnetic material layer 13 described above is attached between the first and second precursor bodies of the unmagnetized material and the respective portion of the yoke prior to magnetizing the unmagnetized material of the precursor bodies. The soft magnetic material layer(s) 13 may be attached to the yoke prior to attaching the precursor bodies or the layer(s) 13 may be first attached to each precursor body, and subsequently both the layer(s) 13 and the precursor bodies may be attached to the yoke.

The unmagnetized material of the precursor body may be magnetized by any desired magnetization method after the precursor body or bodies is/are attached to the yoke or support. For example, the preferred step of magnetizing the first precursor body comprises placing a coil around the first precursor body, applying a pulsed magnetic field to the first precursor body to convert the unmagnetized material of the first precursor body into at least one first permanent magnet body, and removing the coil from the first permanent magnet body. Likewise, the step of magnetizing the second precursor body, if such a body is present, comprises placing a coil around the second precursor body, applying a pulsed magnetic field to the second precursor body to convert the at least one unmagnetized material of the second precursor body to at least one permanent magnet body, and removing the coil from around the second permanent magnet body.

The same or different coils may be used to magnetize the first and second precursor bodies. For example, a first coil may be placed around the first precursor body and a second coil may be placed around the second precursor body. A pulsed current or voltage is applied to the coils simultaneously or sequentially to apply a pulsed magnetic field to the first and second precursor bodies. Alternatively, only one coil may be used to sequentially magnetize the first and second precursor bodies. The coil is first placed around the first precursor body and a magnetic field is applied to magnetize the first precursor body. Thereafter, the same coil is placed around the second precursor body and a magnetic field is applied to magnetize the second precursor body.

Figure 19:
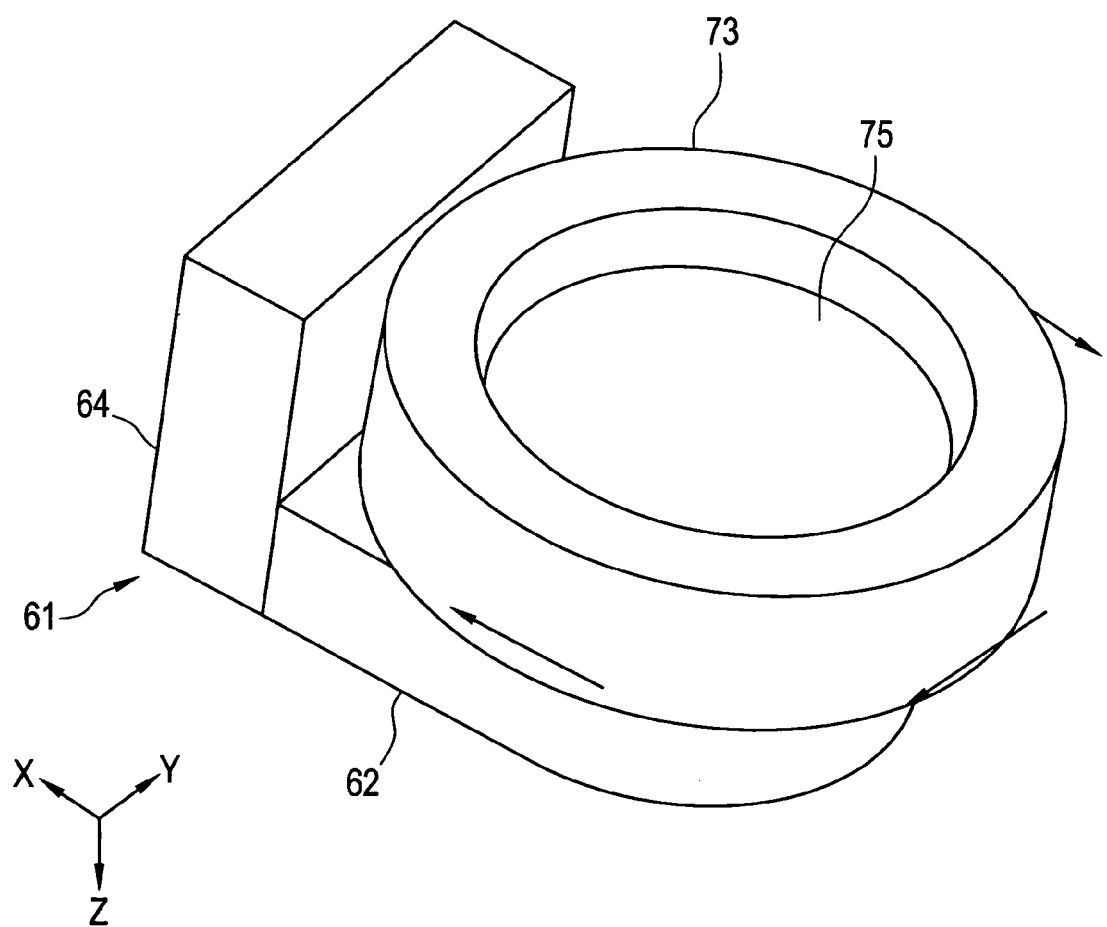
FIG. 19 is a perspective view of a coil housing used to magnetize an unmagnetized material suitable for use as a permanent magnet.

Preferably, the coil that is placed around the precursor body is provided in a housing 73 that fits snugly around the precursor body 75 located on a portion 62 of the yoke 61, as shown in FIG. 19. For example, for a precursor body 75 having a cylindrical outer configuration, such as the body 15 shown in FIG. 4, the housing 73 comprises a hollow ring whose inner diameter is slightly larger than the outer diameter of the precursor body 75. The coil is located inside the walls of the housing 75.

Preferably, a cooling system is also provided in the housing 73 to improve the magnetization process. For example, the cooling system may comprise one or more a liquid nitrogen flow channels inside the walls of the housing 73. The liquid nitrogen is provided through the housing 73 during the magnetization step. Preferably, a magnetic field above 2.5 Tesla, most preferably above 3.0 Tesla, is provided by the coil to magnetize the unmagnetized material, such as the RMB alloy, of the precursor body or bodies.

Thus, if desired, the movable PM body may be magnetized at the same time as the fixed PM body by placing the coil around both movable and fixed PM bodies and applying a pulsed magnetic field. Alternatively, the movable PM body may be magnetized at a different time than the fixed PM body. For example since the movable PM body is smaller than the fixed PM body, the movable PM body may be magnetized prior to being provided into the MRI system. In contrast, the larger fixed PM body may be magnetized after it is attached to the MRI yoke to improve the safety and ease of handling of this body.

Preferably, the pocket 33 in the fixed PM body 15 is filled with metal shims, such as iron or other metal shims. Preferably, the fixed PM body 15, the movable PM body 22 and/or 26 and the shim dimensions are designed at the same time and the fixed and movable PM bodies and the shims are formed based on this design. For example, the dimensions of the permanent magnet assembly may be adjusted to achieve the most easily shimmed permanent magnet body design.

When designing the shim and permanent magnet body dimensions, the capacity of the shim system given random perturbations of the design point are examined. The permanent magnet body shape and dimensions are then designed to optimize the $B_0$ field and the shimmability of the assembly, while taking into account temperature gradients during operation. A computer simulation may then be used to determine a range of inhomogeniety for each design point, to determine how to shim the perturbations to generate a shimmability score for each point and to fit a transfer function, and to optimize the design of the magnet assembly for shimmability.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

What is claimed is:

1. A permanent magnet assembly located in an imaging system, the assembly comprising:
   a fixed permanent magnet body having an opening formed therein; and
   a movable permanent magnet body disposed at least partially within the opening and movable relative to the fixed permanent magnet body.

2. The assembly of claim 1, wherein:
   the fixed permanent magnet body is fixed to a support; and
   the movable permanent magnet body is movable relative to the fixed permanent magnet body during a Bo field adjustment of the assembly and is adapted not to move relative to the fixed permanent magnet body while the assembly is in operation.

3. The assembly of claim 2, wherein the movable permanent magnet body is located between the fixed permanent body and the support.

4. The assembly of claim 2, wherein:
   the support comprises a yoke of the imaging system and the movable permanent magnet body is located between a back side of the fixed permanent magnet body and the yoke;
   the fixed permanent magnet body comprises first surface and a stepped second surface which isadapted to face an imaging volume of the imaging apparatus;
   the stepped second surface contains at least four steps;
   at least one layer of soft magnetic material is attached to the first surface of the fixed permanent magnet body, such that movable permanent magnet body is movable in the opening located in the at least one layer of soft magnetic material;
   the at least one layer of soft magnetic material is attached the yoke;
   the fixed permanent magnet body comprises a cylindrical base section having a major first surface attached to the at least one layer of a soft magnetic material and a major second surface having at least three steps, and a hollow ring section attached to an outer portion of second surface of the base section;
   the ring section extends at least 0.05 meters above an outer step on the second surface of the base section to form a pocket; and
   the pocket is filled with metal shims.

5. The assembly of claim 1, wherein the movable permanent magnet body comprises removable permanent magnet pieces located in the opening in the assembly and which are adapted to be added or removed from the assembly to adjust a Bo field of the assembly.

6. The assembly of claim 4, wherein the permanent magnet pieces are located at least partially in a portion of the opening which extends into the fixed permanent magnet body.

7. The assembly of claim 4, wherein the permanent magnet pieces have a positive magnetization with respect to the magnetization of the fixed permanent magnet body.

8. The assembly of claim 4, wherein the permanent magnet pieces have a negative magnetization with respect to the magnetization of the fixed permanent magnet body.

9. The assembly of claim 1, wherein the movable permanent magnet body comprises a movable permanent magnet plug which is moved relative to the fixed permanent magnet body by an actuator.

10. The assembly of claim 9, wherein the permanent magnet plug is located in the opening which extends partially into the fixed permanent magnet body and the permanent magnet plug is located at least partially in a portion of the opening which extends into the fixed permanent magnet body.

11. The assembly of claim 9, further comprising a metal backing located between the actuator and the permanent magnet plug.

12. A magnetic imaging apparatus, comprising:
   a yoke comprising a first portion, a second portion and at least one third portion connecting the first and the second portions such that an imaging volume is formed between the first and the second portions; and a first permanent magnet assembly attached to the first yoke portion, the permanent magnet assembly comprising:
  a fixed permanent magnet body having an opening formed therein; and
  a movable permanent magnet body disposed at least partially within a portion of the opening and movable relative to the fixed permanent magnet body.

13. The apparatus of claim 12, wherein:
the fixed permanent magnet body is fixed to the first portion of the yoke; and
the movable permanent magnet body is movable relative to the fixed permanent magnet body during a Bo field adjustment of the first assembly and is adapted not to move relative to the fixed permanent magnet body while the apparatus is in operation.

14. The apparatus of claim 13, wherein:
the fixed permanent magnet body comprises a first surface and a second surface which is adapted to face an imaging volume of the imaging apparatus; and
the movable permanent magnet body is located between the first surface of the fixed permanent body and the first portion of the yoke.

15. The apparatus of claim 14, further comprising:
at least one layer of soft magnetic material attached to the first surface of the fixed permanent magnet body; and
a first opening which extends through the at least one layer of soft magnetic material and through the first portion of the yoke, wherein the movable permanent magnet body is located in the first opening.

16. The apparatus of claim 15, wherein:
the fixed permanent magnet body comprises a permanent magnet RMB material, where R comprises at least one rare earth element and M comprises at least one transition metal;
the permanent magnet RMB material comprises 13–19 atomic percent R, 4–20 atomic percent B and the balance M, where R comprises 50 atomic percent or greater Pr, 0.1–10 atomic percent of at least one of Ce, Y and La, and the balance Nd, and M comprises Fe;
the at least one layer of a soft magnetic material comprises a laminate of Fe—Si, Fe—Al, Fe—Co, Fe—Ni, Fe—Al—Si, Fe—Co—V, Fe—Cr—Ni or amorphous Fe—or Co-base alloy layers;
the at least one layer of soft magnetic material is attached the yoke;
the second surface of the fixed permanent magnet body contains at least four steps;
the fixed permanent magnet body is larger than the movable permanent magnet body;
the fixed permanent magnet body comprises a cylindrical base section having a major first surface attached to the at least one layer of a soft magnetic material and a major second surface having at least three steps, and a hollow ring section attached to an outer portion of second surface of the base section;
the ring section extends at least 0.05 meters above an outer step on the second surface of the base section to form a pocket; and
the pocket is filled with metal shims.

17. The apparatus of claim 15, wherein the first opening extends partially into the fixed permanent magnet body and the movable permanent magnet body is located at least partially in a portion of the first opening which extends into the fixed permanent magnet body.

18. The apparatus of claim 17, wherein the permanent magnet pieces have a positive magnetization with respect to the magnetization of the fixed permanent magnet body.

19. The apparatus of claim 17, wherein the permanent magnet pieces have a negative magnetization with respect to the magnetization of the fixed permanent magnet body.

20. The apparatus of claim 14, wherein the movable permanent magnet body comprises removable permanent magnet pieces which are adapted to be added or removed from the first assembly to adjust the Bo field of the first assembly.

21. The apparatus of claim 14, wherein the movable permanent magnet body comprises a movable permanent magnet plug which is moved relative to the fixed permanent magnet body by an actuator.

22. The apparatus of claim 21, further comprising a metal backing located between the actuator and the permanent metal plug.

23. The apparatus of claim 12, further comprising:
  a second permanent magnet assembly attached to the second yoke portion, the second permanent magnet assembly comprising:
  a fixed permanent magnet body having an opening formed therein; and
  a movable permanent magnet body disposed at least partially within a portion of the opening and movable relative to the fixed permanent magnet body.

24. A permanent magnet assembly located in an imaging system, the assembly comprising:
  a first permanent magnet body fixed to a support and having an opening formed therein; and
  a second permanent magnet means disposed at least partially within a portion of the opening for moving relative to the first permanent magnet body to adjust a Bo field of the assembly and for not moving relative to the first permanent magnet body while the assembly is in operation.

25. The assembly of claim 24, wherein the second permanent magnet means is moved relative to the first permanent magnet body by being added or removed from the assembly to adjust the Bo field of the assembly.

26. The assembly of claim 24, wherein:
the support comprises a yoke of the imaging system; and
the second permanent magnet means is located between a back side of the first permanent magnet body and the yoke.

27. A method of making a permanent magnet assembly for use in an imaging system, the method comprising:
  providing a fixed permanent magnet body;
  providing an opening in the fixed permanent magnet body;
  providing a movable permanent magnet body at least partially disposed within the opening; and
  moving the movable permanent magnet body relative to the fixed permanent magnet body to adjust a Bo field of the assembly.

28. The method of claim 27, wherein:
the fixed permanent magnet body is fixed to a support; and
the movable permanent magnet body moves relative to the fixed permanent magnet body during the Bo field adjustment of the assembly and does not move relative to the fixed permanent magnet body while the assembly is in operation.

29. The method of claim 28, wherein:
the support comprises a yoke of the imaging system; and the movable permanent magnet body is moved in the opening in the yoke which extends at least to a back side of the fixed permanent magnet body.

30. The method of claim 27, wherein the step of moving the movable permanent magnet body comprises adding or removing removable permanent magnet pieces to and from an opening located in the assembly.

31. The method of claim 30, wherein the removable permanent magnet pieces are provided into the opening which extends partially into the fixed permanent magnet body, such that the permanent magnet pieces are located at least partially in a portion of the opening which extends into the fixed permanent magnet body.

32. The method of claim 30, wherein the permanent magnet pieces have a positive or a negative magnetization with respect to the magnetization of the fixed permanent magnet body.

33. The method of claim 30, further comprising adding or removing a metal backing material to and from the assembly to keep a metal volume of the assembly constant irrespective of a number of permanent magnet pieces added to or removed from the assembly.

34. The method of claim 27, wherein the step of moving the movable permanent magnet body comprises using an actuator to move a movable permanent magnet plug relative to the fixed permanent magnet body.

35. The method of claim 34, wherein the permanent magnet plug is located in the opening which extends partially into the fixed permanent magnet body and the permanent magnet plug is located at least partially in a portion of the opening which extends into the fixed permanent magnet body.

36. The method of claim 34, wherein the movable permanent magnet plug and the fixed permanent magnet body are magnetized after the movable permanent magnet plug and the fixed permanent magnet body are attached to a support of an imaging system.

37. The method of claim 27, further comprising attaching at least one layer of a soft magnetic material to the fixed permanent magnet body such that the movable permanent magnet body is located in the opening in the at least one layer of a soft magnetic material.

38. The method of claim 27, further comprising:
designing the fixed permanent magnet body and the shim dimensions at the same time; and
forming the fixed permanent magnet body and shimming the permanent magnet assembly based on the design.

39. The method of claim 27, wherein the B0 field adjustment is performed in conjunction with shimming the permanent magnet assembly.

40. The method of claim 27, wherein the fixed permanent magnet body is larger than the movable permanent magnet body.

* * * * *

UNITED STATES PATENT AND TRADEMARK OFFICE
CERTIFICATE OF CORRECTION

PATENT NO. : 7,148,689 B2
APPLICATION NO. : 10/672720
DATED : December 12, 2006
INVENTOR(S) : Xianrui Huang et al.

It is certified that error appears in the above-identified patent and that said Letters Patent is hereby corrected as shown below:

On the Title Page, Item (54)

The title of the patent is incorrect. Please correct the title as follows:

--PERMANENT MAGNET ASSEMBLY WITH MOVABLE PERMANENT BODY FOR MAIN MAGNETIC FIELD ADJUSTMENT--.

Signed and Sealed this

Eighteenth Day of August, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,148,689 B2 | Page 1 of 1 |
| APPLICATION NO. | : 10/672720 | |
| DATED | : December 12, 2006 | |
| INVENTOR(S) | : Xianrui Huang et al. | |

It is certified that error appears in the above-identified patent and that said Letters Patent is hereby corrected as shown below:

On the Title Page, Item (54) and Column 1, lines 1-3

The title of the patent is incorrect. Please correct the title as follows:

--PERMANENT MAGNET ASSEMBLY WITH MOVABLE PERMANENT BODY FOR MAIN MAGNETIC FIELD ADJUSTMENT--.

This certificate supersedes the Certificate of Correction issued August 18, 2009.

Signed and Sealed this

Eighth Day of September, 2009

David J. Kappos
*Director of the United States Patent and Trademark Office*